US012310049B2

(12) United States Patent
Chiang et al.

(10) Patent No.: US 12,310,049 B2
(45) Date of Patent: May 20, 2025

(54) SEMICONDUCTOR DEVICE STRUCTURE WITH NANOSTRUCTURE

(71) Applicant: Taiwan Semiconductor Manufacturing Company, Ltd., Hsinchu (TW)

(72) Inventors: Hung-Li Chiang, Taipei (TW); Yu-Chao Lin, Hsinchu (TW); Chao-Ching Cheng, Hsinchu (TW); Tzu-Chiang Chen, Hsinchu (TW); Tung-Ying Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/751,953

(22) Filed: Jun. 24, 2024

(65) Prior Publication Data

US 2024/0347635 A1 Oct. 17, 2024

Related U.S. Application Data

(60) Continuation of application No. 17/866,803, filed on Jul. 18, 2022, now Pat. No. 12,040,400, which is a (Continued)

(51) Int. Cl.
*H10D 30/62* (2025.01)
*H10D 30/01* (2025.01)
(Continued)

(52) U.S. Cl.
CPC ........... *H10D 30/62* (2025.01); *H10D 30/024* (2025.01); *H10D 30/6219* (2025.01); (Continued)

(58) Field of Classification Search
CPC .. H10D 30/62; H10D 30/024; H10D 30/6219; H10D 62/118; H10D 84/0158; (Continued)

(56) References Cited

U.S. PATENT DOCUMENTS 9,209,247 B2 12/2015 Colinge et al.
9,236,267 B2 1/2016 De et al.
(Continued)

FOREIGN PATENT DOCUMENTS

KR 10-2016-0136290 A 11/2016

*Primary Examiner* — Mohammad M Hoque
(74) *Attorney, Agent, or Firm* — Birch, Stewart, Kolasch & Birch, LLP

(57) ABSTRACT

A semiconductor device structure is provided. The semiconductor device structure includes a substrate. The semiconductor device structure includes a first nanostructure over the substrate. The semiconductor device structure includes a gate stack over the substrate and surrounding the first nanostructure. The semiconductor device structure includes a first source/drain structure and a second source/drain structure over the substrate. The gate stack is between the first source/drain structure and the second source/drain structure. The semiconductor device structure includes an inner spacer layer covering a sidewall of the first source/drain structure and partially between the gate stack and the first source/drain structure. The first nanostructure passes through the inner spacer layer. The semiconductor device structure includes a dielectric structure over the gate stack and extending into the inner spacer layer. The dielectric structure covers a top surface, an inner wall, and a lower surface of the inner spacer layer.

20 Claims, 35 Drawing Sheets

900 920 912 914 930 932 256 912 920 922 916 910 190 190 220 220 180 160 160 180 250 128 128 170 170 126 126 124 122 210 114 110 112

Related U.S. Application Data division of application No. 16/930,839, filed on Jul. 16, 2020, now Pat. No. 11,393,925.

(60) Provisional application No. 62/955,647, filed on Dec. 31, 2019.

(51) Int. Cl.
*H10D 62/10* (2025.01)
*H10D 84/01* (2025.01)
*H10D 84/03* (2025.01)

(52) U.S. Cl.
CPC ....... *H10D 62/118* (2025.01); *H10D 84/0158* (2025.01); *H10D 84/038* (2025.01)

(58) Field of Classification Search
CPC ............... H10D 84/038; H10D 64/252; H10D 84/0188; H10D 84/144; H10D 84/201; H10D 48/345; H10D 64/117; H10D 84/619; A23B 2/754; A23B 2/605; A61K 40/4218; A61K 40/13; H02K 15/027; B82Y 10/00; H10H 20/826; H10F 99/00
USPC .......................................................... 257/365
See application file for complete search history.

(56) References Cited

U.S. PATENT DOCUMENTS

| | | | | |
|---|---|---|---|---|
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,653,289 | B1 | 5/2017 | Balakrishnan et al. | |
| 9,954,058 | B1 | 4/2018 | Mochizuki et al. | |
| 10,014,390 | B1 | 7/2018 | Bouche et al. | |
| 10,056,454 | B2 | 8/2018 | Kim et al. | |
| 10,103,238 | B1 | 10/2018 | Zang et al. | |
| 10,217,849 | B2 | 2/2019 | Barraud et al. | |
| 10,615,256 | B2 | 4/2020 | Cheng et al. | |
| 10,797,163 | B1 | 10/2020 | Yu et al. | |
| 11,069,684 | B1 | 7/2021 | Xie et al. | |
| 11,081,547 | B2 | 8/2021 | Reboth et al. | |
| 2013/0341704 | A1 | 12/2013 | Rachmady et al. | |
| 2014/0001441 | A1 | 1/2014 | Kim et al. | |
| 2016/0027929 | A1 | 1/2016 | Cheng et al. | |
| 2016/0211264 | A1 | 7/2016 | Peng | |
| 2017/0040321 | A1 | 2/2017 | Mitard | |
| 2017/0053998 | A1 | 2/2017 | Kim et al. | |
| 2017/0069481 | A1 | 3/2017 | Doris et al. | |
| 2017/0365604 | A1 | 12/2017 | Suh et al. | |
| 2018/0090582 | A1 | 3/2018 | Adusumilli et al. | |
| 2018/0151438 | A1 | 5/2018 | Chiang et al. | |
| 2018/0175167 | A1 | 6/2018 | Reboth et al. | |
| 2019/0355723 | A1 | 11/2019 | Miao et al. | |
| 2019/0378915 | A1 | 12/2019 | Frougier et al. | |
| 2020/0006154 | A1 | 1/2020 | Chiang et al. | |
| 2020/0027791 | A1* | 1/2020 | Loubet ................ | H10D 84/038 |
| 2020/0027959 | A1 | 1/2020 | Cheng et al. | |
| 2020/0075720 | A1 | 3/2020 | Cheng et al. | |
| 2020/0227535 | A1 | 7/2020 | Sung et al. | |
| 2020/0266060 | A1 | 8/2020 | Cheng et al. | |
| 2020/0381426 | A1 | 12/2020 | Xu et al. | |
| 2020/0388681 | A1 | 12/2020 | Yamashita et al. | |
| 2020/0402984 | A1 | 12/2020 | Reznicek et al. | |

* cited by examiner 1N
1N'
100
D1
D2
W1
W2
W3
111
112
114
122
124
126
126a
126b
126c
128
128a
128b
128c
160
164
166
170
174
180
181
190
194
210
211
212
214
216
220
222
250
251
252
254

500
190
180
220
252a
128
254a
126
160
170
250
W1
W4
W5
252
254
124
122
210
114
112

600
190
180
128
126
220
160
170
252a
254a
250
W4
W5
W1
114
112
252
254
124
122
110
210

SEMICONDUCTOR DEVICE STRUCTURE WITH NANOSTRUCTURE

PRIORITY CLAIM AND CROSS-REFERENCE

This application is a Continuation of U.S. application Ser. No. 17/866,803, filed on Jul. 18, 2022, which is a Divisional of U.S. application Ser. No. 16/930,839, filed on Jul. 16, 2020, which claims the benefit of U.S. Provisional Application No. 62/955,647, filed on Dec. 31, 2019, and entitled "SEMICONDUCTOR DEVICE STRUCTURE AND METHOD FOR FORMING THE SAME", the entirety of which is incorporated by reference herein.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1N-1 is a perspective view of the semiconductor device structure of FIG. 1N, in accordance with some embodiments.

FIG. 10G-1 is a perspective view of the semiconductor device structure of FIG. 10G, in accordance with some embodiments.

DETAILED DESCRIPTION

Figure 1A:
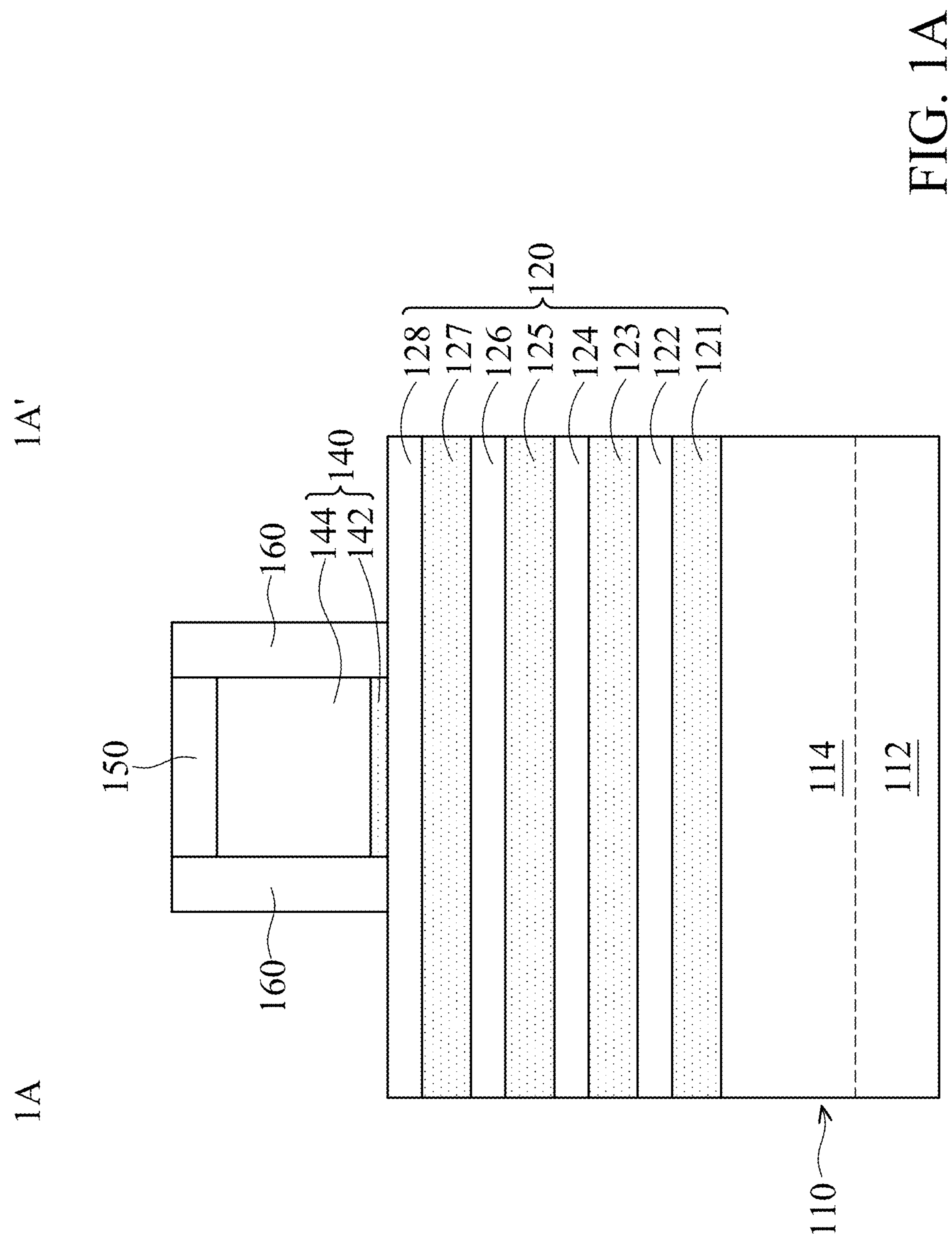
FIGS. 1A-IN are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" or "about" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "about" in conjunction with a specific distance or size is to be interpreted so as not to exclude insignificant deviation from the specified distance or size. The term "substantially" or "about" may be varied in different technologies and be in the deviation range understood by the skilled in the art. For example, the term "substantially" or "about" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figures 1, 1A:
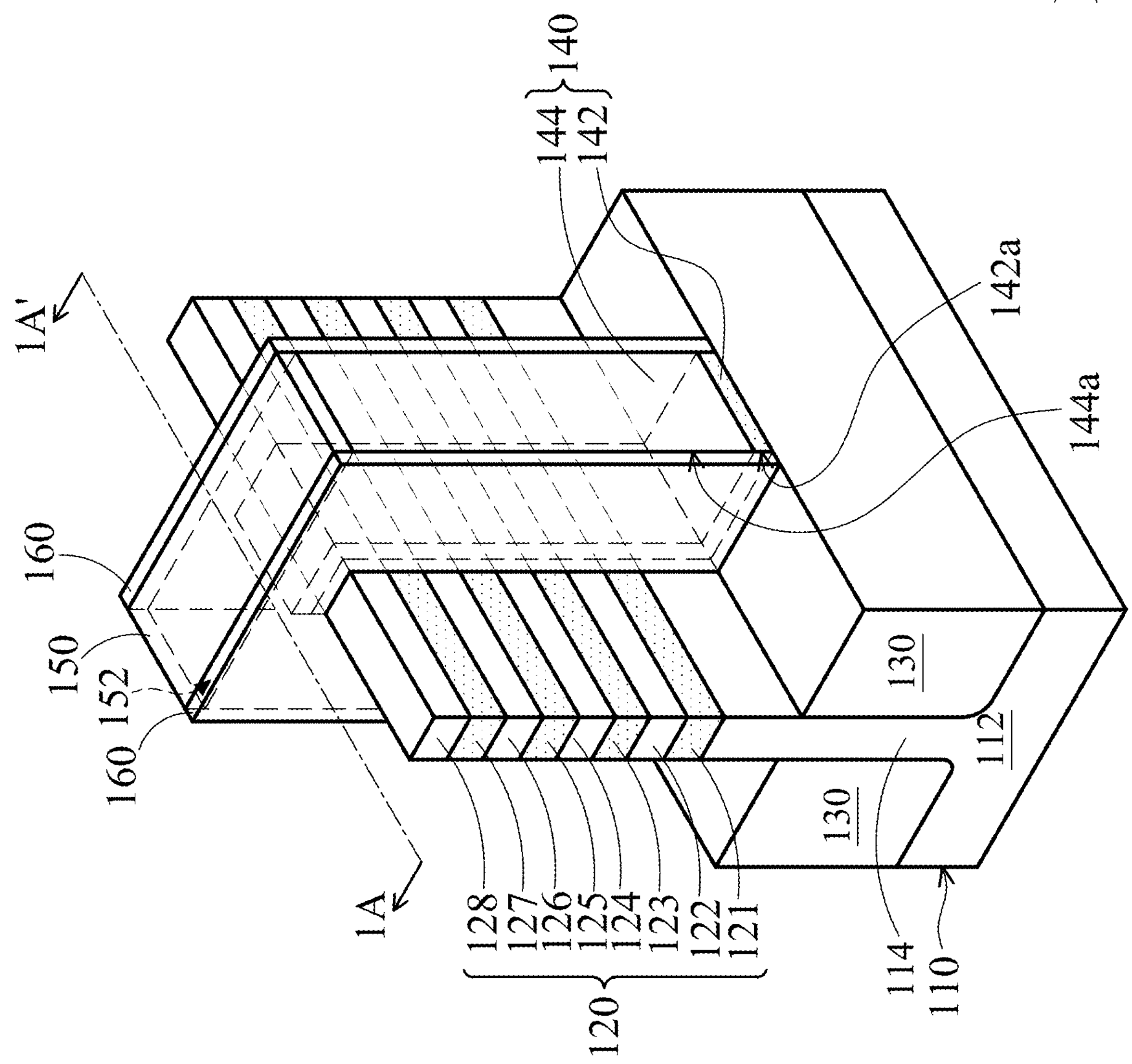

FIGS. 1A-IN are cross-sectional views of various stages of a process for forming a semiconductor device structure, in accordance with some embodiments. FIG. 1A-1 is a perspective view of the semiconductor device structure of FIG. 1A, in accordance with some embodiments. FIG. 1A is a cross-sectional view illustrating the semiconductor device structure along a sectional line 1A-1A' in FIG. 1A-1, in accordance with some embodiments.

As shown in FIGS. 1A and 1A-1, a substrate 110 is provided, in accordance with some embodiments. The substrate 110 has a base 112 and a fin 114 over the base 112, in accordance with some embodiments. The substrate 110 includes, for example, a semiconductor substrate. The substrate 110 includes, for example, a semiconductor wafer (such as a silicon wafer) or a portion of a semiconductor wafer.

In some embodiments, the substrate 110 is made of an elementary semiconductor material including silicon or germanium in a single crystal structure, a polycrystal structure, or an amorphous structure. In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

As shown in FIGS. 1A and 1A-1, a nanostructure stack 120 is formed over the fin 114, in accordance with some embodiments. The nanostructure stack 120 includes nanostructures 121, 122, 123, 124, 125, 126, 127, and 128, in accordance with some embodiments.

The nanostructures 121, 122, 123, 124, 125, 126, 127, and 128 are sequentially stacked over the fin 114, in accordance with some embodiments. The nanostructures 121, 122, 123, 124, 125, 126, 127, and 128 include nanowires or nanosheets, in accordance with some embodiments.

The nanostructures 121, 123, 125, and 127 are made of a same first material, in accordance with some embodiments. The first material is different from the material of the substrate 110, in accordance with some embodiments. The first material includes an elementary semiconductor material including silicon or germanium in a single crystal structure, a polycrystal structure, or an amorphous structure, in accordance with some embodiments.

The first material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

The nanostructures 122, 124, 126, and 128 are made of a same second material, in accordance with some embodiments. The second material is different from the first material, in accordance with some embodiments. The second material is the same as the material of the substrate 110, in accordance with some embodiments. The second material includes an elementary semiconductor material including silicon or germanium in a single crystal structure, a polycrystal structure, or an amorphous structure, in accordance with some embodiments.

The second material includes a compound semiconductor, such as silicon carbide, gallium arsenide, gallium phosphide, indium phosphide, indium arsenide, an alloy semiconductor, such as SiGe or GaAsP, or a combination thereof, in accordance with some embodiments.

As shown in FIGS. 1A-1 and 1A, an isolation layer 130 is formed over the base 112, in accordance with some embodiments. The fin 114 is partially embedded in the isolation layer 130, in accordance with some embodiments. The fin 114 is surrounded by the isolation layer 130, in accordance with some embodiments.

The isolation layer 130 is made of a dielectric material such as an oxide-containing material (e.g., silicon oxide), an oxynitride-containing material (e.g., silicon oxynitride), a low-k (low dielectric constant) material, a porous dielectric material, glass, or a combination thereof, in accordance with some embodiments. The glass includes borosilicate glass (BSG), phosphoric silicate glass (PSG), borophosphosilicate glass (BPSG), fluorinated silicate glass (FSG), or a combination thereof, in accordance with some embodiments.

The isolation layer 130 is formed using a deposition process (or a spin-on process), a chemical mechanical polishing process, and an etching back process, in accordance with some embodiments. The deposition process includes a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

As shown in FIGS. 1A and 1A-1, a gate stack 140 and a mask layer 150 are formed over the nanostructure stack 120, the fin 114, and the isolation layer 130, in accordance with some embodiments. The gate stack 140 includes a gate dielectric layer 142 and a gate electrode 144, in accordance with some embodiments. The gate electrode 144 is over the gate dielectric layer 142, in accordance with some embodiments.

The gate dielectric layer 142 is positioned between the gate electrode 144 and the nanostructure stack 120, in accordance with some embodiments. The gate dielectric layer 142 is also positioned between the gate electrode 144 and the fin 114, in accordance with some embodiments. The gate dielectric layer 142 is positioned between the gate electrode 144 and the isolation layer 130, in accordance with some embodiments.

The gate dielectric layer 142 is made of an oxide-containing material such as silicon oxide, in accordance with some embodiments. The gate dielectric layer 142 is formed using a chemical vapor deposition process and an etching process, in accordance with some embodiments. The gate electrode 144 is made of a semiconductor material such as polysilicon, in accordance with some embodiments. The gate electrode 144 is formed using a chemical vapor deposition process and an etching process, in accordance with some embodiments.

The mask layer 150 is positioned over the gate stack 140, in accordance with some embodiments. The mask layer 150 is made of a different material than the gate stack 140, in accordance with some embodiments. The mask layer 150 is made of nitrides (e.g., silicon nitride) or oxynitride (e.g., silicon oxynitride), in accordance with some embodiments.

As shown in FIGS. 1A and 1A-1, a spacer structure 160 is formed over sidewalls 142*a*, 144*a* and 152 of the gate dielectric layer 142, the gate electrode 144 and the mask layer 150, in accordance with some embodiments. The spacer structure 160 surrounds the gate stack 140 and the mask layer 150, in accordance with some embodiments. The spacer structure 160 is positioned over the nanostructure stack 120, the fin structure 114 and the isolation layer 130, in accordance with some embodiments.

The spacer structure 160 includes insulating materials, such as silicon oxide, silicon nitride, silicon oxynitride, or silicon carbide, in accordance with some embodiments. The spacer structure 160 is made of a material different from that of the gate stack 140 and the mask layer 150, in accordance with some embodiments. The formation of the spacer structure 160 includes deposition processes and an anisotropic etching process, in accordance with some embodiments.

Figure 1B:
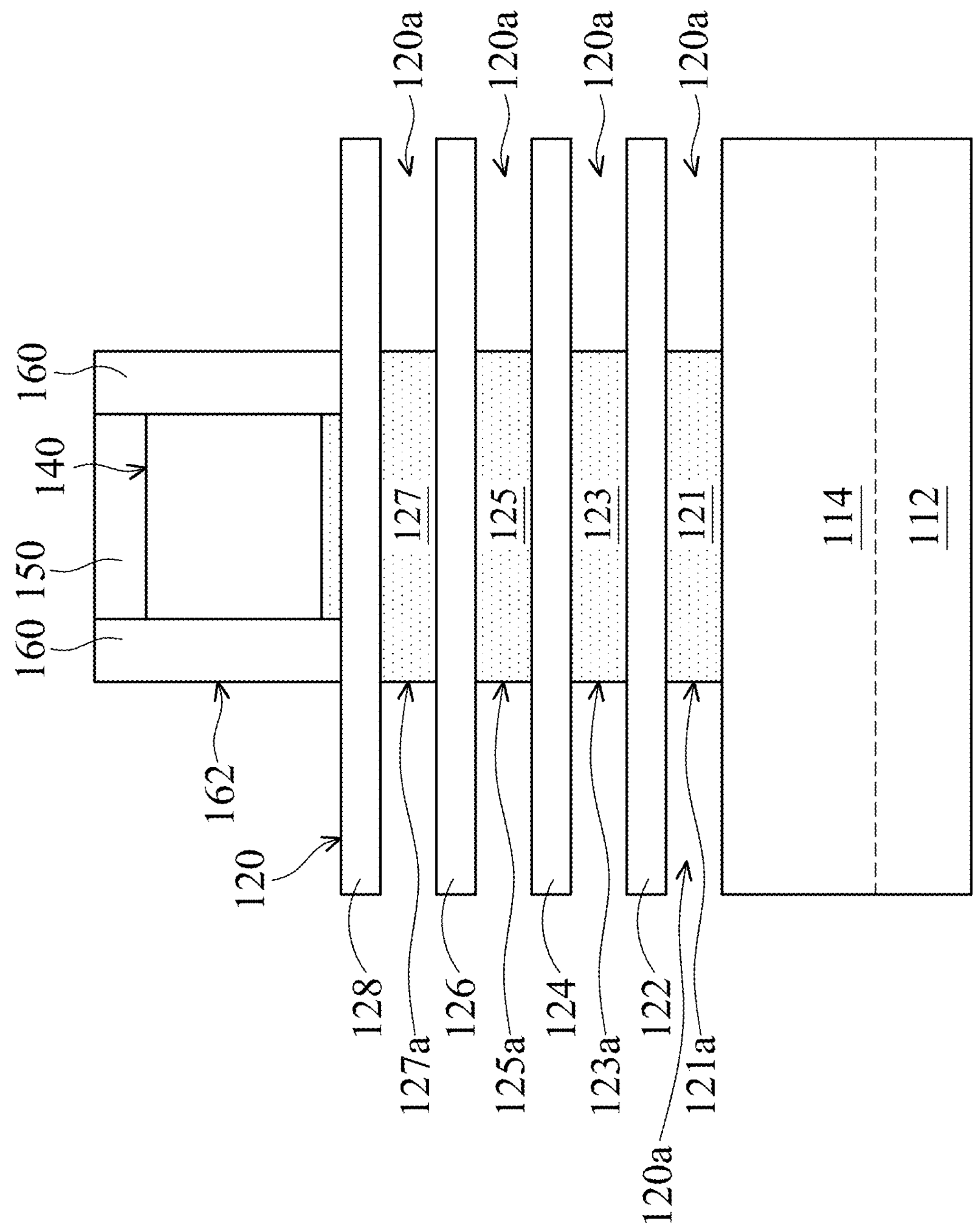

As shown in FIG. 1B, end portions of the nanostructures 121, 123, 125 and 127, which are not covered by the gate stack 140 and the spacer structure 160, are removed, in accordance with some embodiments. The removal process forms trenches 120*a* in the nanostructure stack 120, in accordance with some embodiments.

As shown in FIG. 1B, sidewalls 121*a*, 123*a*, 125*a* and 127*a* of the nanostructures 121, 123, 125 and 127 are substantially aligned with (or substantially coplanar with) sidewalls 162 of the spacer structure 160, in accordance with some embodiments. The removal process includes an etching process, in accordance with some embodiments. The etching process includes an anisotropic etching process such as a dry etching process, in accordance with some embodiments.

Figure 1C:
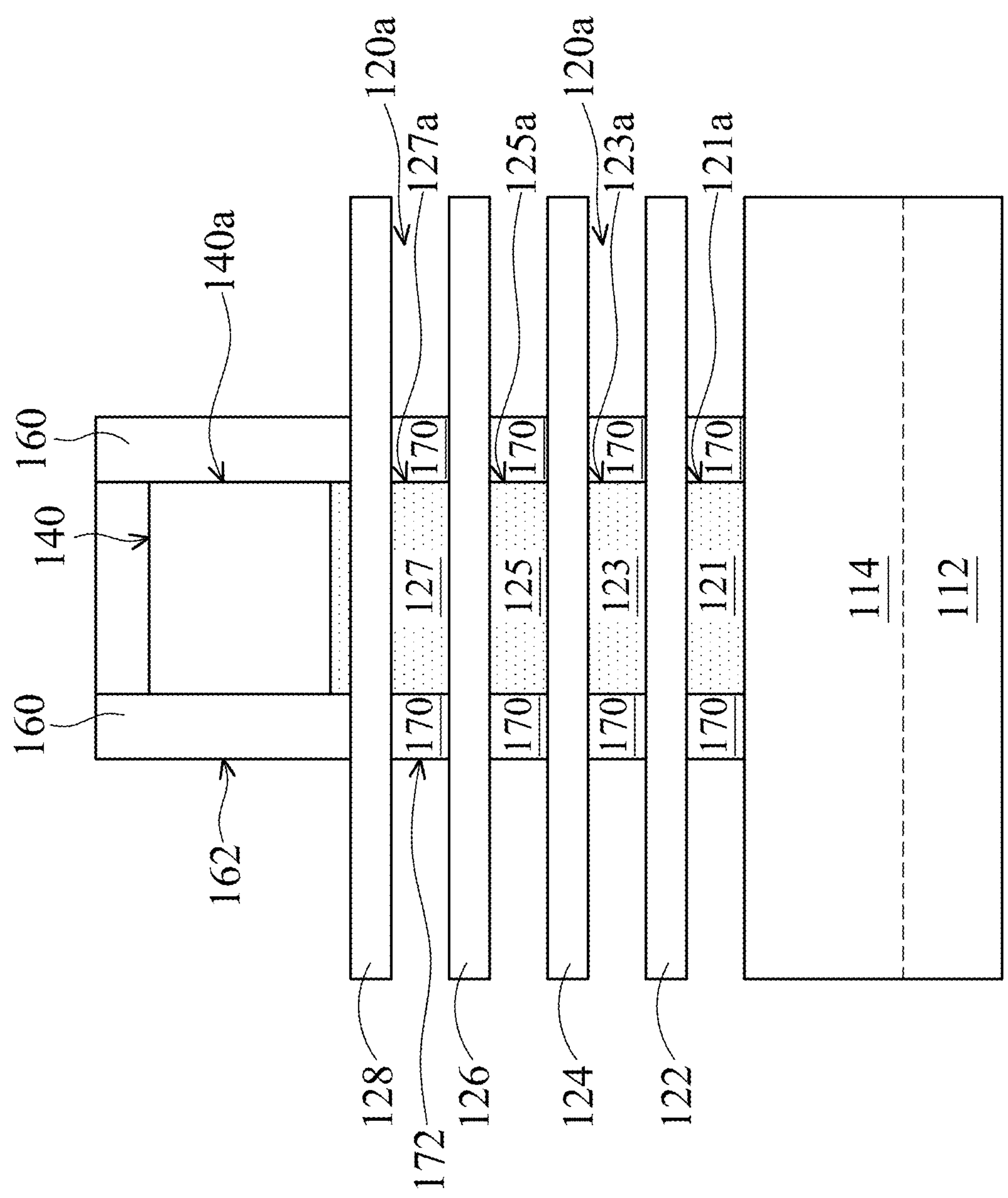

As shown in FIG. 1C, portions of the nanostructures 121, 123, 125 and 127 are removed through the trenches 120*a*, in accordance with some embodiments. The removal process includes an etching process such as a dry etching process or a wet etching process, in accordance with some embodiments.

As shown in FIG. 1C, an inner spacer layer 170 is formed over the sidewalls 121*a*, 123*a*, 125*a* and 127*a* of the nanostructures 121, 123, 125 and 127, in accordance with some embodiments. The inner spacer layer 170 is in direct contact with the sidewalls 121*a*, 123*a*, 125*a* and 127*a*, in accordance with some embodiments. As shown in FIG. 1C, sidewalls 172 of the inner spacer layer 170 are substantially aligned with (or substantially coplanar with) the sidewalls 162 of the spacer structure 160, in accordance with some embodiments.

The inner spacer layer 170 is made of an insulating material, such as an oxide-containing material (e.g., silicon oxide), a nitride-containing material (e.g., silicon nitride), an oxynitride-containing material (e.g., silicon oxynitride), a carbide-containing material (e.g., silicon carbide), a high-k material (e.g., $HfO_2$, $ZrO_2$, $HfZrO_2$, or $Al_2O_3$), or a low-k material, in accordance with some embodiments.

The term "high-k material" means a material having a dielectric constant greater than the dielectric constant of silicon dioxide, in accordance with some embodiments. The term "low-k material" means a material having a dielectric constant less than the dielectric constant of silicon dioxide, in accordance with some embodiments.

In some embodiments, the inner spacer layer 170 is formed using a deposition process and an etching process. The deposition process includes a physical vapor deposition process, a chemical vapor deposition process, an atomic layer deposition process, or the like, in accordance with some embodiments.

In some other embodiments, the inner spacer layer 170 is formed using a selective deposition process such as an atomic layer deposition process. In some still other embodiments, the removal of the portions of the nanostructures 121, 123, 125 and 127 through the trenches 120*a* is not performed, and the inner spacer layer 170 is formed by directly oxidizing the portions of the nanostructures 121, 123, 125 and 127 through the trenches 120*a*.

Figure 1D:
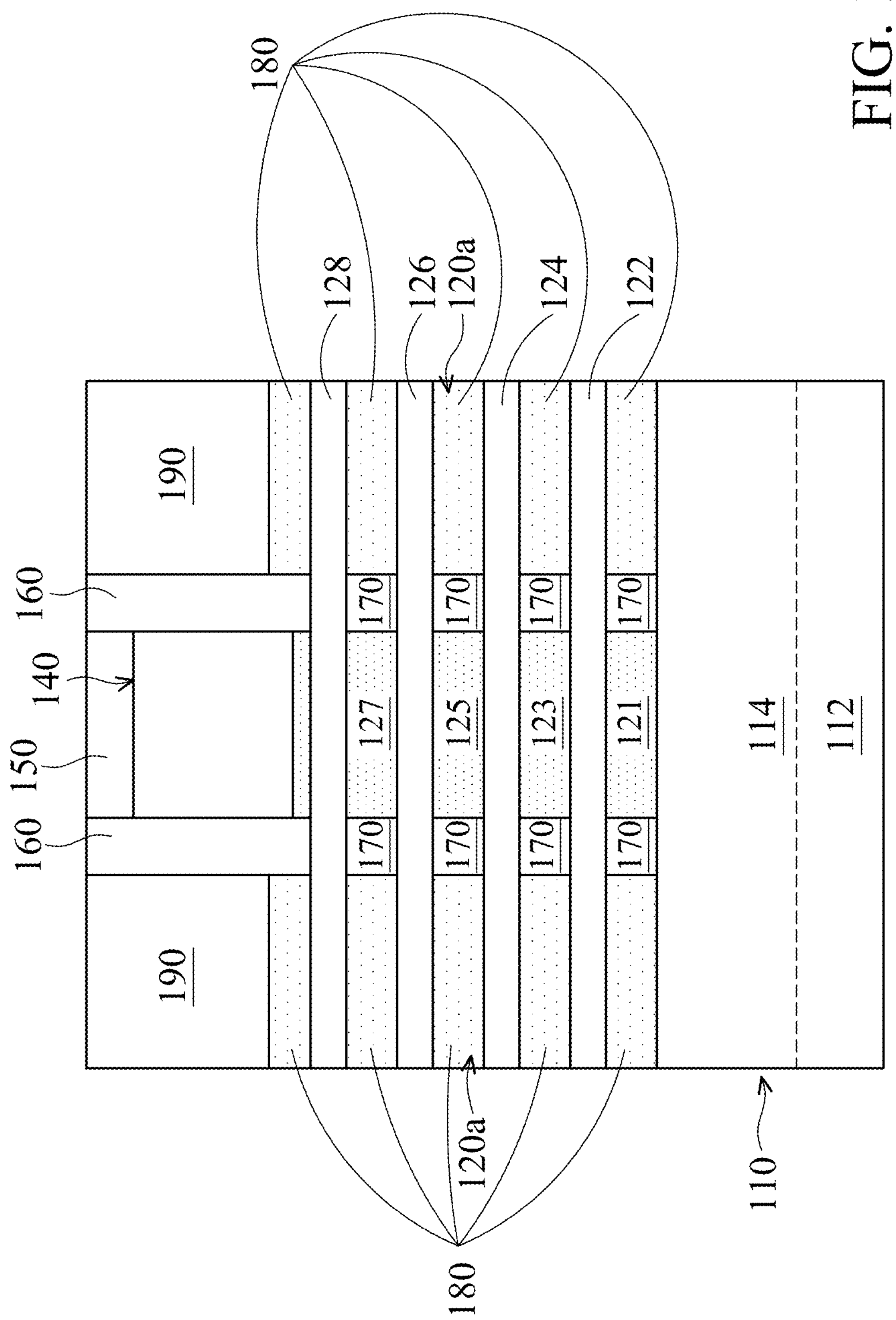

As shown in FIG. 1D, source/drain structures 180, such as stressor structures, are formed in the trenches 120*a*, in accordance with some embodiments. The source/drain structures 180 surround the nanostructures 122, 124, 126 and 128, in accordance with some embodiments. The source/drain structures 180 are in direct contact with the nanostructures 122, 124, 126 and 128, the spacer structure 160, the inner spacer layer 170, and the substrate 110, in accordance with some embodiments.

In some embodiments, the source/drain structures 180 are made of a semiconductor material (e.g., silicon germanium). In some embodiments, the source/drain structures 180 are doped with P-type dopants. The P-type dopants include the Group IIIA element, in accordance with some embodiments. The Group IIIA element includes boron or another suitable material.

In some other embodiments, the source/drain structures 180 are made of a semiconductor material (e.g., silicon or silicon carbide). The source/drain structures 180 are doped with N-type dopants, such as the Group VA element, in accordance with some embodiments. The Group VA element includes phosphor (P), antimony (Sb), or another suitable Group VA material. The source/drain structures 180 are formed using an epitaxial process, in accordance with some embodiments.

As shown in FIG. 1D, a dielectric layer 190 is formed over the source/drain structures 180, in accordance with some embodiments. The dielectric layer 190 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 190 is formed by a deposition process (e.g., a chemical vapor deposition process) and a planarization process (e.g., a chemical mechanical polishing process), in accordance with some embodiments.

Figure 1E:
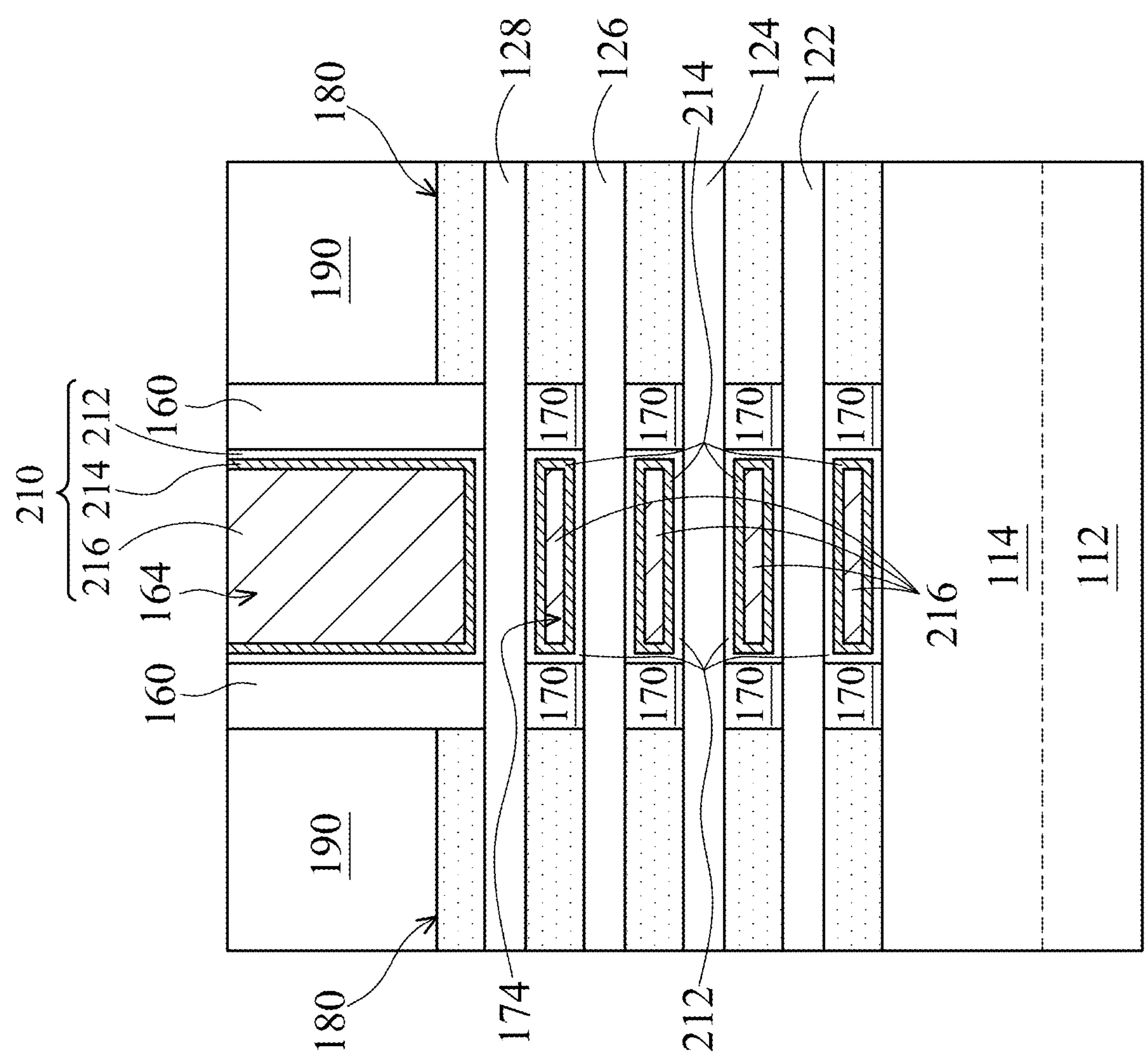

As shown in FIGS. 1D and 1E, the gate stack 140 and the mask layer 150 are removed, in accordance with some embodiments. The removal process forms a trench 164 in the spacer structure 160, in accordance with some embodiments. As shown in FIGS. 1D and 1E, the nanostructures 121, 123, 125 and 127 are removed through the trench 164, in accordance with some embodiments. The removal process for removing the gate stack 140, the mask layer 150 and the nanostructures 121, 123, 125 and 127 includes an etching process such as a wet etching process or a dry etching process, in accordance with some embodiments.

As shown in FIG. 1E, a gate stack 210 is formed in the trench 164, in accordance with some embodiments. The gate stack 210 surrounds the nanostructures 122, 124, 126 and 128, in accordance with some embodiments. The nanostructures 122, 124, 126 and 128 pass through the gate stack 210, the inner spacer layer 170, and the source/drain structures 180, in accordance with some embodiments. The gate stack 210 includes a gate dielectric layer 212, a work function metal layer 214, and a gate electrode layer 216, in accordance with some embodiments.

The gate dielectric layer 212 conformally covers the nanostructures 122, 124, 126 and 128 and inner walls and a bottom surface of the trench 164, in accordance with some embodiments. The gate dielectric layer 212 is made of a high-K material, such as $HfO_2$, $La_2O_3$, CaO, $ZrO_2$, $HfZrO_2$, or $Al_2O_3$, in accordance with some embodiments. The gate dielectric layer 212 is formed using an atomic layer deposition process or another suitable process.

The work function metal layer 214 is conformally formed over the gate dielectric layer 212, in accordance with some embodiments. The work function metal layer 214 is made of titanium-containing material (e.g., TiN or TiSiN), tantalum-containing material (e.g., TaN), or another suitable conductive material. The work function metal layer 214 is formed using an atomic layer deposition process or another suitable process.

The gate electrode layer 216 is formed over the work function metal layer 214, in accordance with some embodiments. The gate electrode layer 216 is made of metal (e.g., W, Al, Ta, Ti, or Au), metal nitride (TiN or TaN), or another suitable conductive material. The gate electrode layer 216 is formed using an atomic layer deposition process or another suitable process.

Figure 1F:
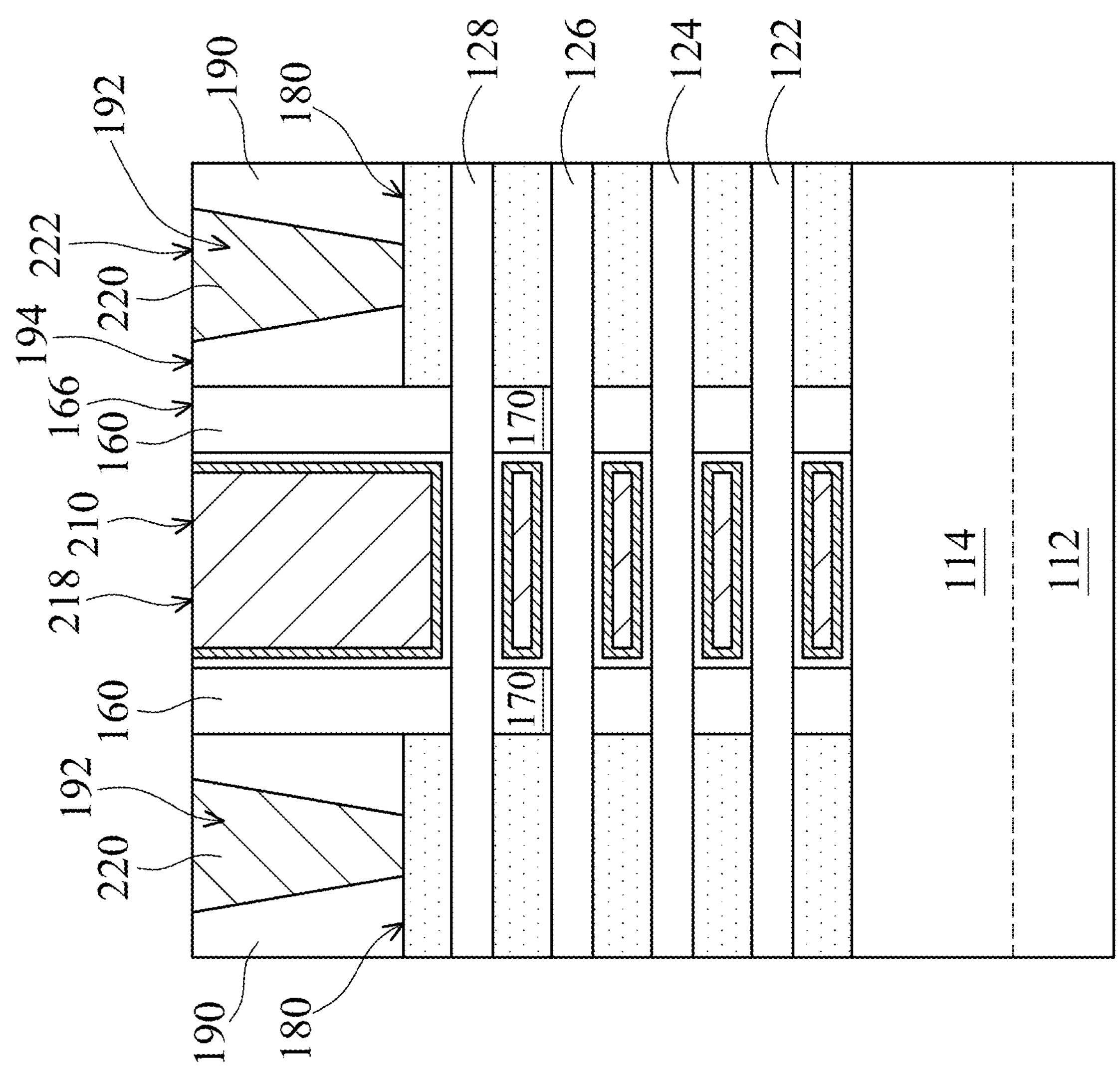

As shown in FIG. 1F, portions of the dielectric layer 190 are removed to form through holes 192 in the dielectric layer 190, in accordance with some embodiments. The through holes 192 expose the source/drain structures 180 thereunder, in accordance with some embodiments. The removal process includes an etching process such as an anisotropic etching process (e.g., a dry etching process), in accordance with some embodiments.

As shown in FIG. 1F, contact structures 220 are formed in the through holes 192, in accordance with some embodiments. The contact structures 220 are electrically connected to the source/drain structures 180 thereunder, in accordance with some embodiments. The contact structures 220 are in direct contact with the source/drain structures 180 thereunder, in accordance with some embodiments. As shown in FIG. 1F, top surfaces 222, 194, 166, and 218 of the contact structures 220, the dielectric layer 190, the spacer structure 160, and the gate stack 210 are substantially coplanar, in accordance with some embodiments.

The contact structures 220 are made of metal (e.g., tungsten, aluminum, copper, or cobalt), alloys thereof, or the like, in accordance with some embodiments. The contact structures 220 are formed using a deposition process (e.g., a physical vapor deposition process or a chemical vapor deposition process) and a planarization process (e.g., a chemical mechanical polishing process), in accordance with some embodiments.

Figure 1G:
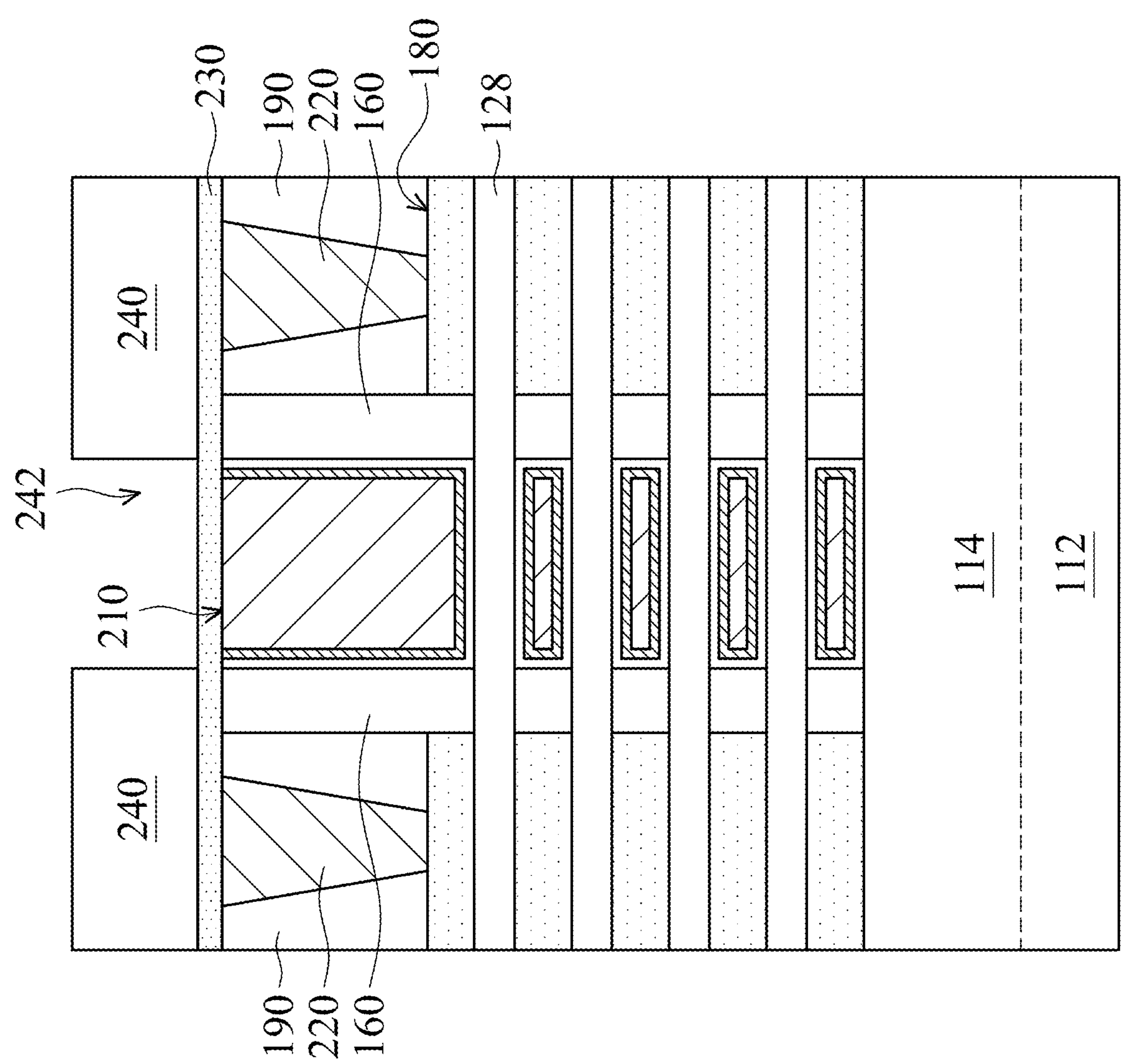

As shown in FIG. 1G, an anti-reflection layer 230 is formed over the contact structures 220, the dielectric layer 190, the spacer structure 160, and the gate stack 210, in accordance with some embodiments. The anti-reflection layer 230 is made of metals (e.g., Cr), semiconductor, nitrides (e.g., CrN, SiN, TiN or TiSiN), oxides (CrON or $Cr_2O_3$), carbides (e.g., SiC), oxynitrides (e.g., SiON), oxycarbides (e.g., SiOC), or combinations thereof. The anti-reflection layer 230 is formed using a deposition process or another suitable process.

As shown in FIG. 1G, a mask layer 240 is formed over the anti-reflection layer 230, in accordance with some embodiments. The mask layer 240 has an opening 242, in accordance with some embodiments. The opening 242 exposes a portion of the anti-reflection layer 230 over the gate stack 210, in accordance with some embodiments. The mask layer 240 is made of a polymer material such as a photoresist material, in accordance with some embodiments. The mask layer 240 is formed using a spin coating process and a photolithography process, in accordance with some embodiments.

As shown in FIG. 1G, after the formation of the mask layer 240, a descum process is performed over the mask layer 240 and the anti-reflection layer 230 to remove residues resulting from the formation of the mask layer 240, in accordance with some embodiments. The removal process includes an etching process such as a plasma etching process, in accordance with some embodiments. The process gasses of the plasma etching process include nitrogen ($N_2$) and oxygen ($O_2$), in accordance with some embodiments. The process pressure ranges from about 3 mTorr to about 30 mTorr, in accordance with some embodiments.

Figure 1H:
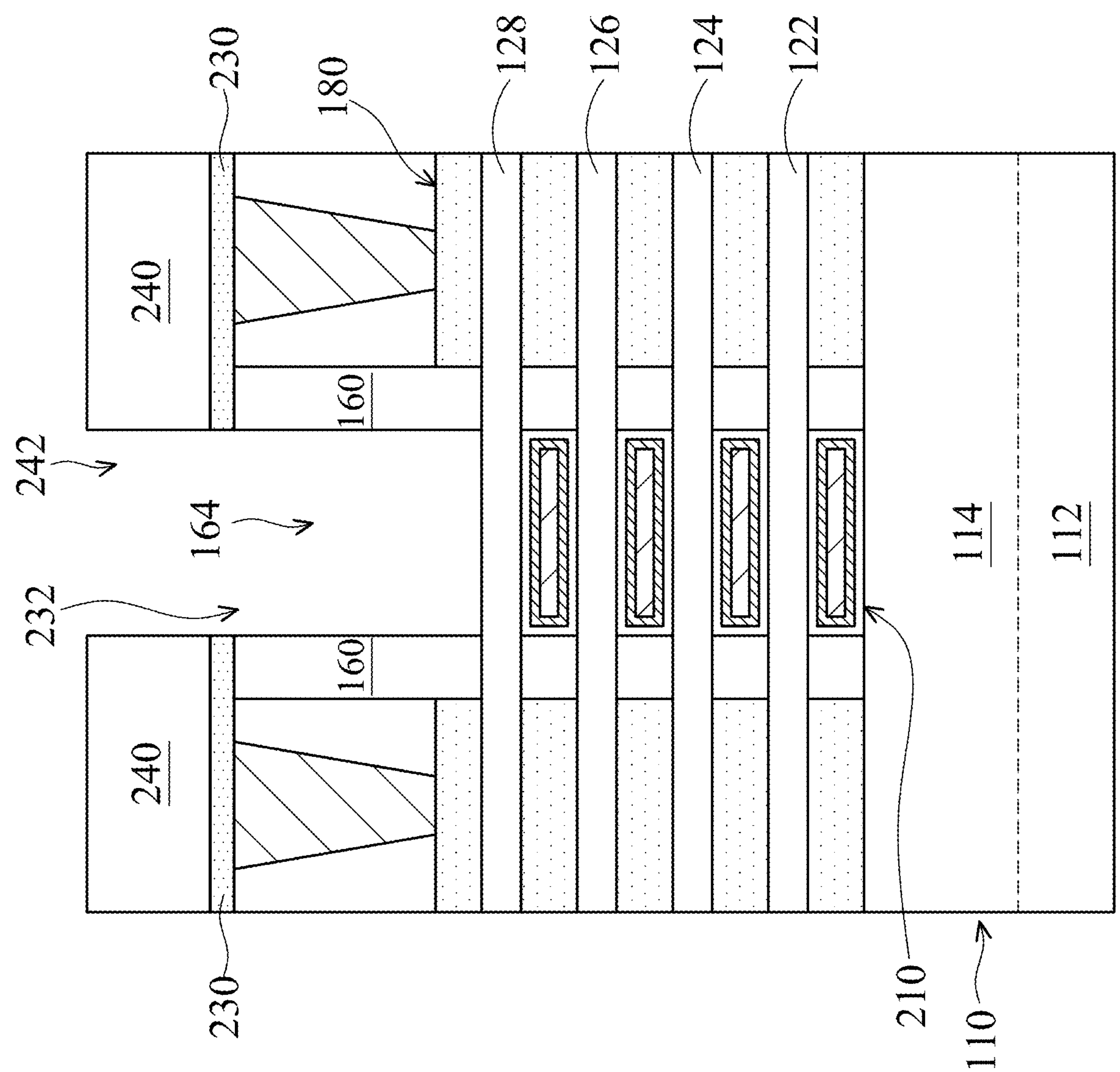

Thereafter, as shown in FIG. 1H, the anti-reflection layer 230 exposed by the opening 242 is removed, in accordance with some embodiments. The removal process includes an etching process such as a plasma etching process, in accordance with some embodiments. The process gasses of the plasma etching process include chlorine ($Cl_2$), oxygen ($O_2$), hydrogen bromide (HBr), and helium (He), in accordance with some embodiments. The process pressure ranges from about 3 mTorr to about 30 mTorr, in accordance with some embodiments.

Afterwards, as shown in FIG. 1H, a portion of the gate stack 210 over the nanostructure 128 and in the trench 164 is removed, in accordance with some embodiments. The removal process includes an etching process such as a plasma etching process, in accordance with some embodiments. The process gasses of the plasma etching process include chlorine ($Cl_2$) and boron trichloride ($BCl_3$), in accordance with some embodiments. The process pressure ranges from about 5 mTorr to about 50 mTorr, in accordance with some embodiments.

Thereafter, as shown in FIG. 1H, a cleaning process is performed over the mask layer 240, the anti-reflection layer 230, the spacer structure 160, and the nanostructure 128 to remove residues resulting from the aforementioned processes, in accordance with some embodiments.

The cleaning process includes an etching process such as a plasma etching process, in accordance with some embodiments. The process gasses of the plasma etching process include diazene ($N_2H_2$), nitrogen ($N_2$), and hydrogen ($H_2$), in accordance with some embodiments. The process pressure ranges from about 20 mTorr to about 100 mTorr, in accordance with some embodiments.

The descum process of FIG. 1G, the removal processes of the anti-reflection layer 230 exposed by the opening 242 and the portion of the gate stack 210 over the nanostructure 128, and the cleaning process of FIG. 1H are performed in the same plasma chamber (not shown), in accordance with some embodiments. That is, the aforementioned removal processes and the aforementioned cleaning process are performed in-situ, in accordance with some embodiments.

The plasma chamber has an electrostatic chuck (ESC) and a chamber wall, in accordance with some embodiments. The chamber wall surrounds the electrostatic chuck, in accordance with some embodiments. The electrostatic chuck is used to support a wafer (e.g., the substrate 110), in accordance with some embodiments. The temperature (or the process temperature) of the plasma chamber ranges from about 60° C. to about 120° C., in accordance with some embodiments.

Figure 1I:
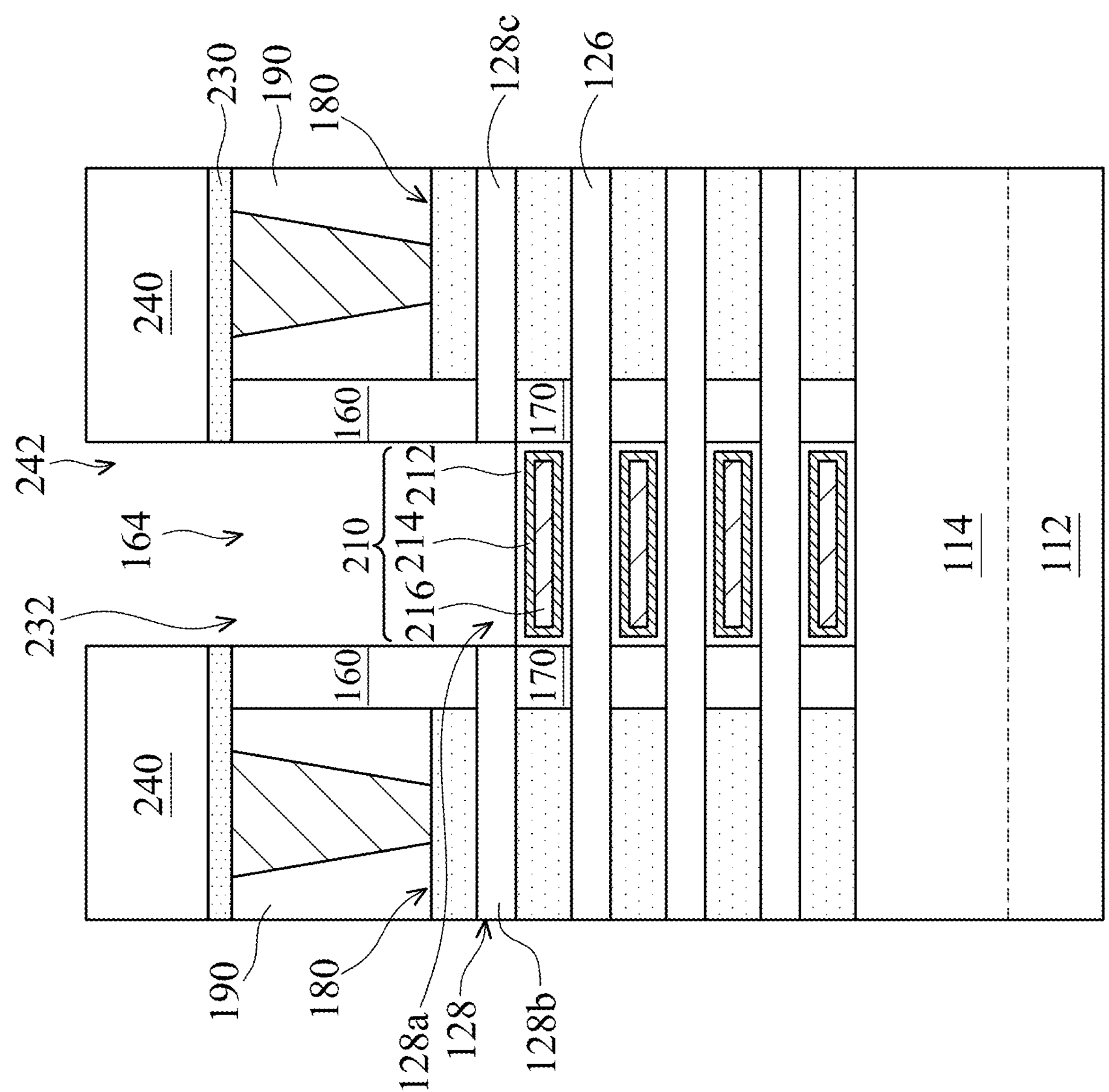

Afterwards, as shown in FIG. 1I, the nanostructure 128 under the trench 164 of the spacer structure 160 is removed through the trench 164 to form a trench 128*a* in the nanostructure 128, in accordance with some embodiments. The nanostructure 128 is divided into portions 128*b* and 128*c* by the trench 128*a*, in accordance with some embodiments. The portions 128*b* and 128*c* are spaced apart from each other, in accordance with some embodiments.

The removal process includes an etching process such as an anisotropic etching process (e.g., a plasma etching process), in accordance with some embodiments. The process gasses of the plasma etching process include hydrogen bromide (HBr), oxygen ($O_2$), and chlorine ($Cl_2$), in accordance with some embodiments. The process pressure ranges from about 3 mTorr to about 20 mTorr, in accordance with some embodiments.

Thereafter, as shown in FIG. 1I, an over etching process is performed over the nanostructure 128 to remove the residues resulting from the removal process of the nanostructure 128 under the trench 164, in accordance with some embodiments. The over etching process includes a plasma etching process, in accordance with some embodiments.

The process gasses of the plasma etching process include nitrogen trifluoride ($NF_3$) and chlorine ($Cl_2$), in accordance with some embodiments. The process pressure ranges from about 20 mTorr to about 60 mTorr, in accordance with some embodiments. The process temperature of the removal process of the nanostructure 128 under the trench 164 and the over etching process ranges from about 50° C. to about 70° C., in accordance with some embodiments.

Figure 1J:
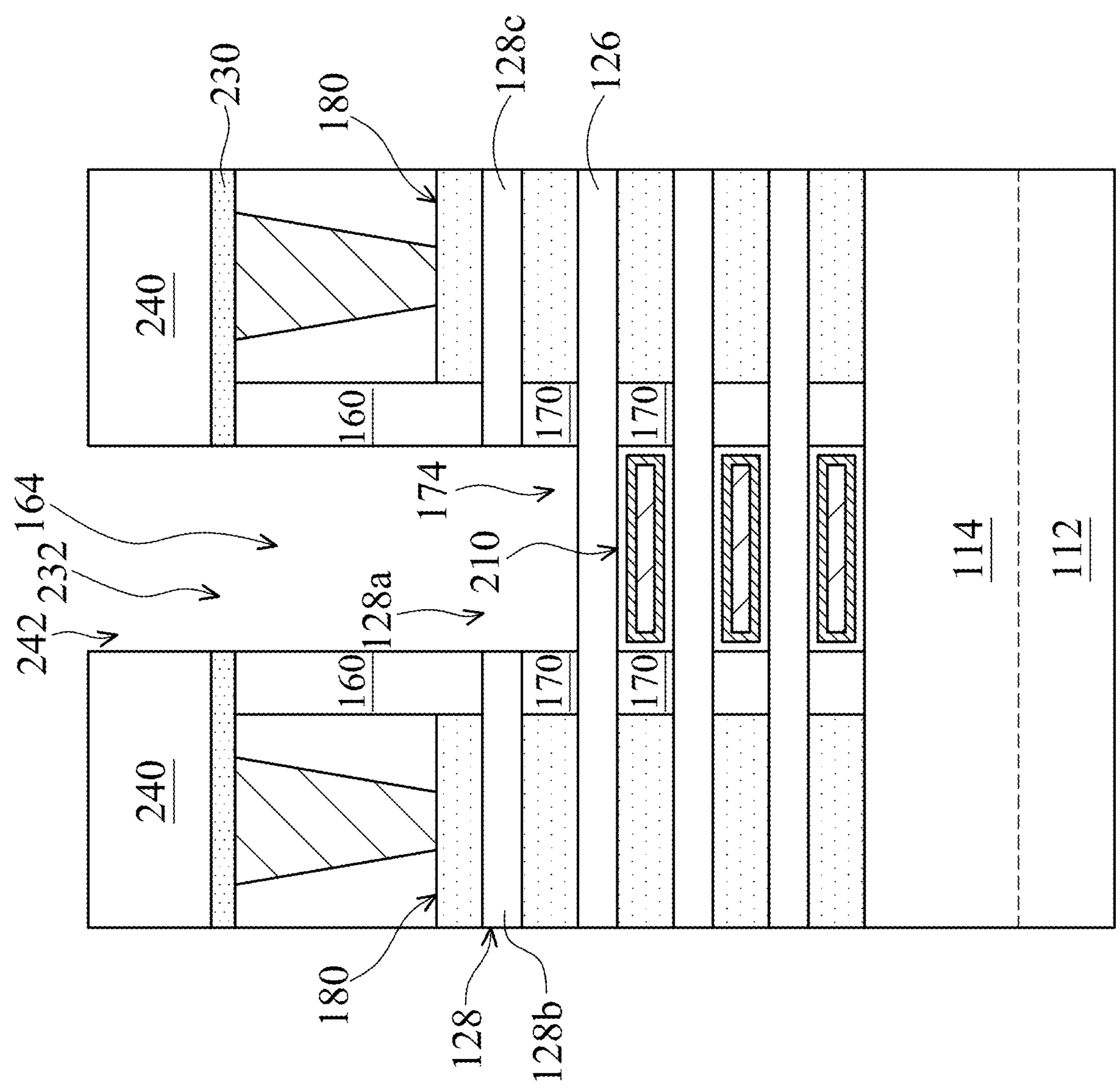

Afterwards, as shown in FIG. 1J, a portion of the gate stack 210 over the nanostructure 126 and in the trench 174 of the inner spacer layer 170 is removed, in accordance with some embodiments. The removal process includes an etching process such as a plasma etching process, in accordance with some embodiments. The process gasses of the plasma etching process include chlorine ($Cl_2$) and boron trichloride ($BCl_3$), in accordance with some embodiments. The process pressure ranges from about 5 mTorr to about 50 mTorr, in accordance with some embodiments.

Thereafter, as shown in FIG. 1J, a cleaning process is performed over the mask layer 240, the anti-reflection layer 230, the spacer structure 160, the inner spacer layer 170, and the nanostructures 126 and 128 to remove residues resulting from the aforementioned processes, in accordance with some embodiments. The cleaning process includes an etching process such as a plasma etching process, in accordance with some embodiments.

The process gasses of the plasma etching process include diazene ($N_2H_2$), nitrogen ($N_2$), and hydrogen ($H_2$), in accordance with some embodiments. The process pressure ranges from about 20 mTorr to about 100 mTorr, in accordance with some embodiments. The process temperature of the removal process of the portion of the gate stack 210 over the nanostructure 126 and the cleaning process of FIG. 1J ranges from about 60° C. to about 120° C., in accordance with some embodiments.

Figure 1K:
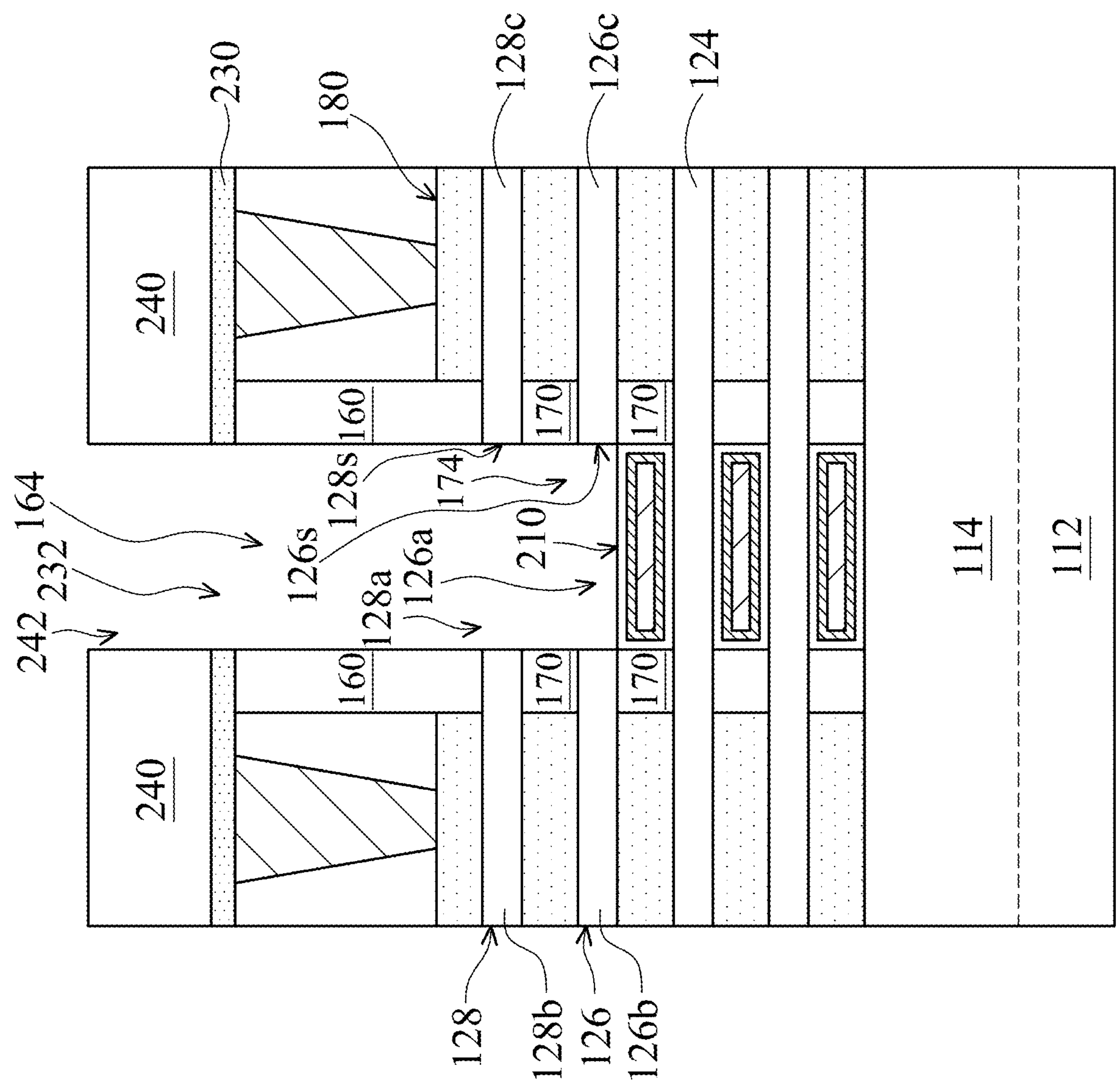

Afterwards, as shown in FIG. 1K, the nanostructure 126 under the trench 164 of the spacer structure 160 is removed through the trench 164 to form a trench 126*a* in the nanostructure 126, in accordance with some embodiments. The nanostructure 126 is divided into portions 126*b* and 126*c* by the trench 126*a*, in accordance with some embodiments. The portions 126*b* and 126*c* are spaced apart from each other, in accordance with some embodiments.

The removal process includes an etching process such as an anisotropic etching process (e.g., a plasma etching process), in accordance with some embodiments. The process gasses of the plasma etching process include hydrogen bromide (HBr), oxygen ($O_2$), and chlorine ($Cl_2$), in accordance with some embodiments. The process pressure ranges from about 3 mTorr to about 20 mTorr, in accordance with some embodiments.

Thereafter, as shown in FIG. 1K, an over etching process is performed over the nanostructure 126 to remove the residues resulting from the removal process of the nanostructure 126 under the trench 164, in accordance with some embodiments. The over etching process includes a plasma etching process, in accordance with some embodiments.

The process gasses of the plasma etching process include nitrogen trifluoride ($NF_3$) and chlorine ($Cl_2$), in accordance with some embodiments. The process pressure ranges from about 20 mTorr to about 60 mTorr, in accordance with some embodiments. The process temperature of the removal process of the nanostructure 126 under the trench 164 and the over etching process ranges from about 50° C. to about 70° C., in accordance with some embodiments.

In some embodiments, the descum process of FIG. 1G, the removal processes of the anti-reflection layer 230 exposed by the opening 242 and the portion of the gate stack 210 over the nanostructure 128 and the cleaning process of FIG. 1H, the removal process of the nanostructure 128 under the trench 164 and the over etching process of FIG. 1I, the removal process of the portion of the gate stack 210 over the nanostructure 126 and the cleaning process of FIG. 1J, the removal process of the nanostructure 126 under the trench 164 and the over etching process of FIG. 1K are performed in the same plasma chamber (not shown), in accordance with some embodiments. That is, the aforementioned descum process, the aforementioned removal processes, the aforementioned cleaning process, and the aforementioned over etching processes are performed in-situ, in accordance with some embodiments.

Figure 1L:
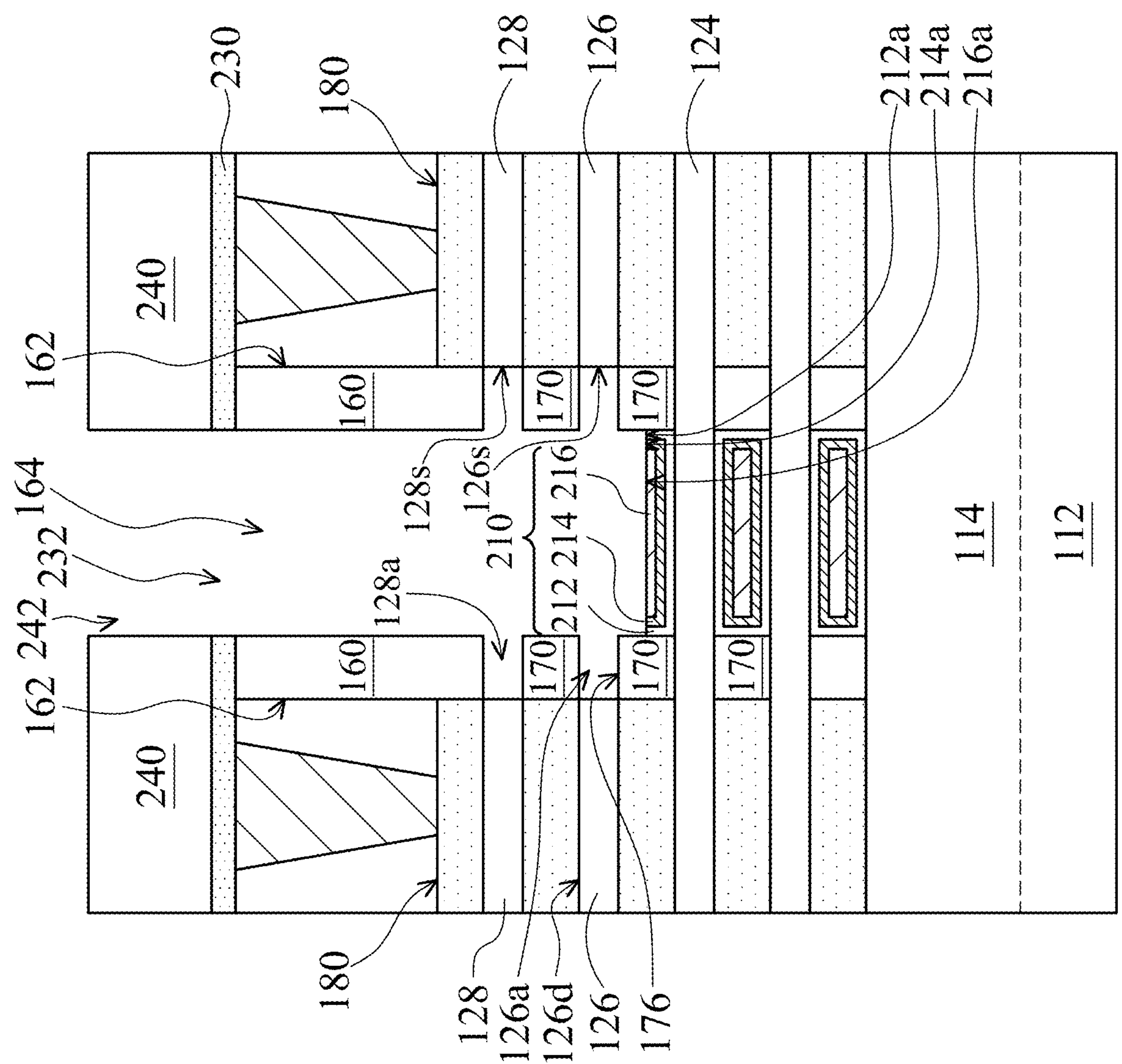

As shown in FIGS. 1K and 1L, portions of the nanostructures 126 and 128 are removed from sidewalls 126*s* and 128*s* of the nanostructures 126 and 128 through the trench 164 of the spacer structure 160, in accordance with some embodiments. The removal process widens the trenches 126*a* and 128*a*, in accordance with some embodiments. After the removal process, the trench 126*a* extends into the inner spacer layer 170, and the trench 128*a* extends between the spacer structure 160 and the inner spacer layer 170, in accordance with some embodiments.

The removal process further removes an upper portion of the gate stack 210 over the nanostructure 124, in accordance with some embodiments. After the removal process, top surfaces 212*a*, 214*a*, and 216*a* of the gate dielectric layer 212, the work function metal layer 214, and the gate electrode layer 216 are substantially coplanar, in accordance with some embodiments.

The top surfaces 212*a*, 214*a*, and 216*a* are lower than a top surface 126*d* of the nanostructure 126, in accordance with some embodiments. The top surfaces 212*a*, 214*a*, and 216*a* are lower than an upper surface 176 of the inner spacer layer 170, in accordance with some embodiments. The removal process includes an isotropic etching process such as a (lateral) wet etching process, in accordance with some embodiments.

Figure 1M:
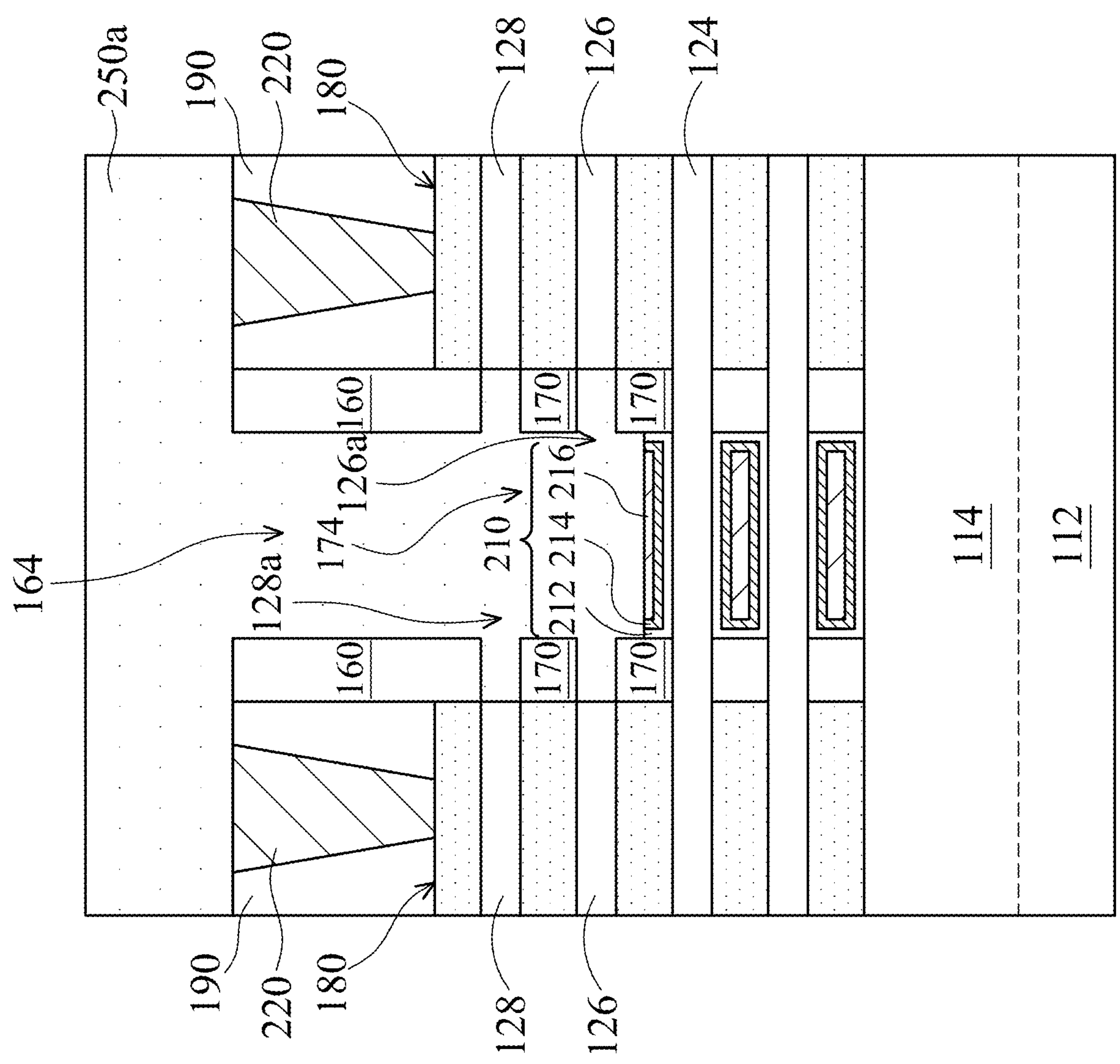

As shown in FIG. 1M, the anti-reflection layer 230 and the mask layer 240 are removed, in accordance with some embodiments. The removal process includes an etching process such as a plasma etching process, in accordance with some embodiments. As shown in FIG. 1M, a dielectric layer 250*a* is formed in the trenches 164, 128*a*, 174, and 126*a* of the spacer structure 160, the nanostructure 128, the inner spacer layer 170, and the nanostructure 126, in accordance with some embodiments.

The dielectric layer 250*a* is made of a low-k (low dielectric constant) dielectric material, in accordance with some embodiments. In some other embodiments, the dielectric layer 250*a* is made of an insulating material, such as an oxide-containing material (e.g., silicon oxide), a nitride-containing material (e.g., silicon nitride), an oxynitride-containing material (e.g., silicon oxynitride), or a carbide-containing material (e.g., silicon carbide), in accordance with some embodiments.

The dielectric layer 250*a* is formed using a deposition process, in accordance with some embodiments. The deposition process includes an atomic layer deposition (ALD) process, a chemical vapor deposition (CVD) process, a high density plasma chemical vapor deposition (HDPCVD) process, a flowable chemical vapor deposition (FCVD) process, a sputtering process, or a combination thereof, in accordance with some embodiments.

Figure 1N:
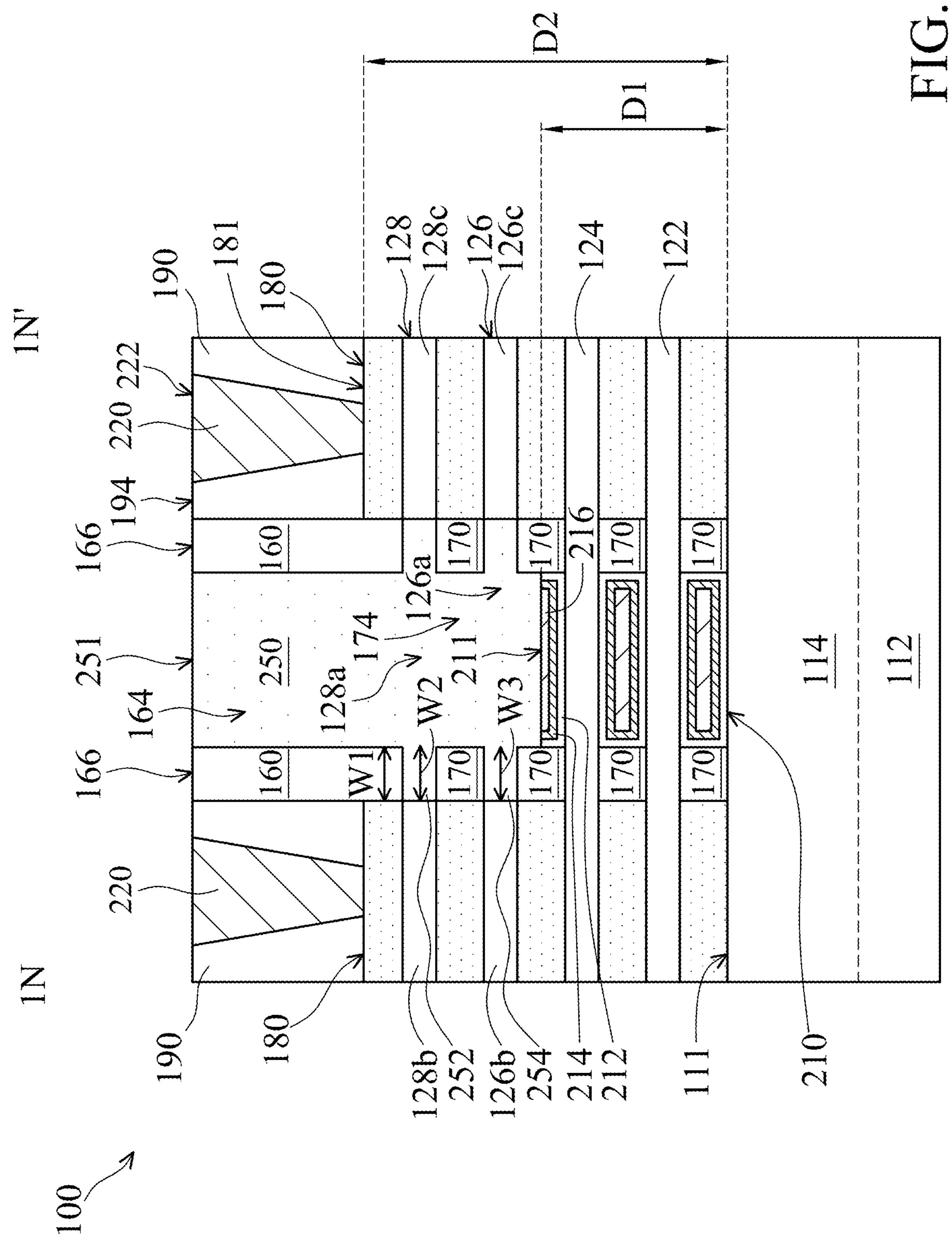
Figures 1, 1N:
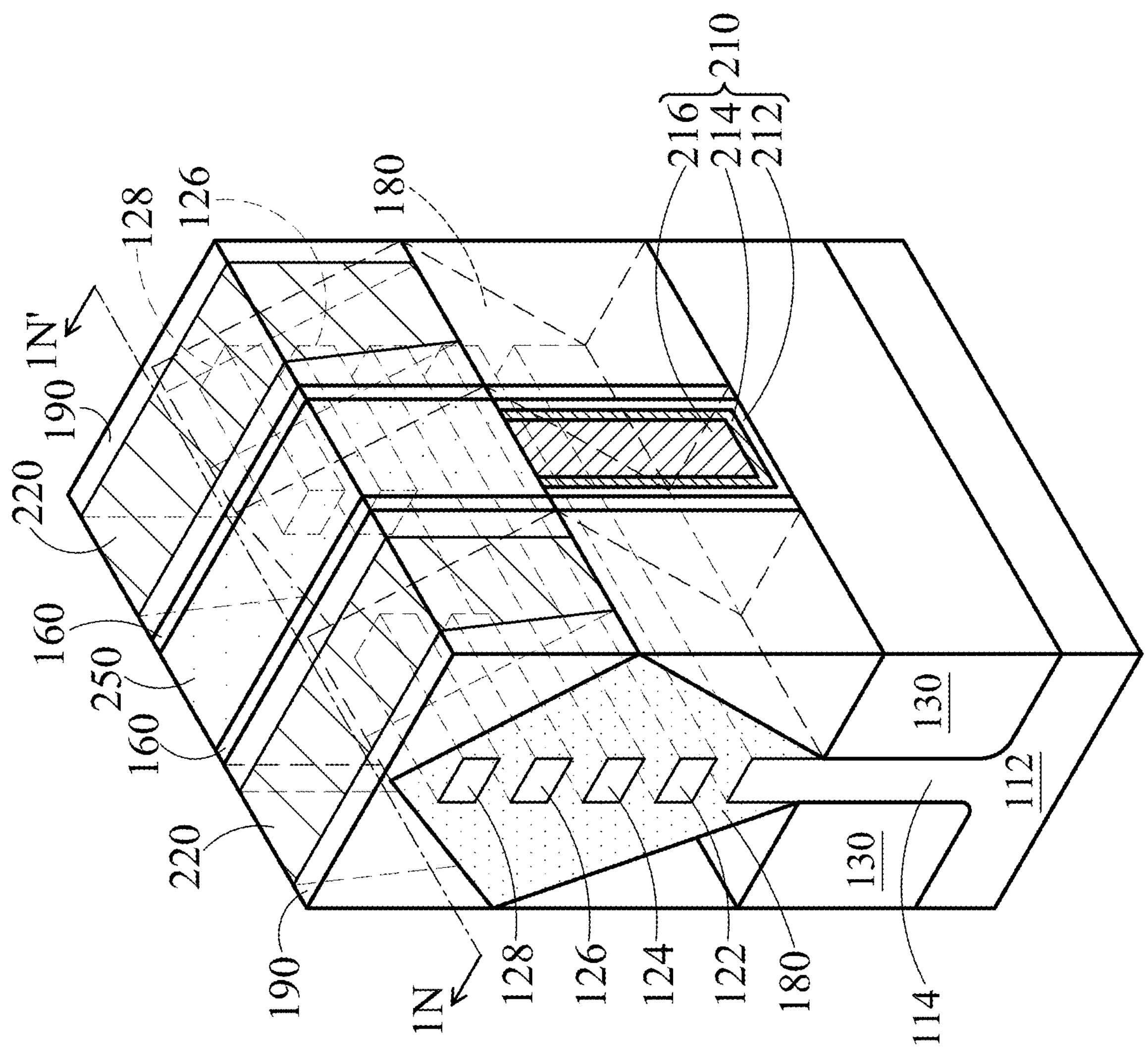

FIG. 1N-1 is a perspective view of the semiconductor device structure of FIG. 1N, in accordance with some embodiments. FIG. 1N is a cross-sectional view illustrating the semiconductor device structure along a sectional line IN-IN' in FIG. 1N-1, in accordance with some embodiments.

As shown in FIGS. 1M, IN and IN–1, the portion of the dielectric layer 250*a* outside of the trenches 164, 128*a*, 174, and 126*a* is removed, in accordance with some embodiments. The dielectric layer 250*a* remaining in the trenches 164, 128*a*, 174, and 126*a* forms a dielectric structure 250, in accordance with some embodiments. In this step, a semiconductor device structure 100 is substantially formed, in accordance with some embodiments.

The top surfaces 222, 194, 166, and 251 of the contact structures 220, the dielectric layer 190, the spacer structure 160, and the dielectric structure 250 are substantially coplanar, in accordance with some embodiments. The dielectric structure 250 laterally extends into the inner spacer layer 170, in accordance with some embodiments. The dielectric structure 250 laterally extends between the inner spacer layer 170 and the spacer structure 160, in accordance with some embodiments.

The dielectric structure 250 is in direct contact with the nanostructures 126 and 128, in accordance with some embodiments. The dielectric structure 250 is in direct contact with the gate dielectric layer 212, the work function layer 214, and the gate electrode layer 216, in accordance with some embodiments.

In some embodiments, a distance D1 between a top surface 211 of the gate stack 210 and a top surface 111 of the substrate 110 is less than a distance D2 between a top surface 181 of the source/drain structure 180 and the top surface 111. The dielectric structure 250 passes through the nanostructures 126 and 128 over the gate stack 210, in accordance with some embodiments.

The dielectric structure 250 has extension portions 252 and 254, in accordance with some embodiments. The extension portion 252 is between the inner spacer layer 170 and the spacer structure 160, in accordance with some embodiments. The extension portion 254 penetrates into the inner spacer layer 170, in accordance with some embodiments. That is, the inner spacer layer 170 surrounds the extension portion 254, in accordance with some embodiments.

The extension portion 254 passes through the inner spacer layer 170, in accordance with some embodiments. The width W1 of the spacer structure 160, the width W2 of the extension portion 252, and the width W3 of the extension portion 254 are substantially equal to each other, in accordance with some embodiments.

The nanostructure 126 (including the portions 126*b* and 126*c*) does not extend into the inner spacer layer 170, in accordance with some embodiments. The nanostructure 128 (including the portions 128*b* and 128*c*) does not extend between the inner spacer layer 170 and the spacer structure 160, in accordance with some embodiments. The removal process includes a planarization process such as a chemical polishing process, in accordance with some embodiments.

Since the portions of the nanostructure 126 in the inner spacer layer 170 are removed, the distance between the nanostructure 126 and the gate stack 210 is increased, in accordance with some embodiments. Therefore, the parasitic capacitance between the gate stack 210 and the nanostructure 126 is decreased, in accordance with some embodiments.

Similarly, since the portions of the nanostructure 128 over the inner spacer layer 170 are removed, the distance between the nanostructure 128 and the gate stack 210 is increased, in accordance with some embodiments. Therefore, the parasitic capacitance between the gate stack 210 and the nanostructure 128 is decreased, in accordance with some embodiments. As a result, the performance of the semiconductor device structure 100 is improved, in accordance with some embodiments.

Figure 2:
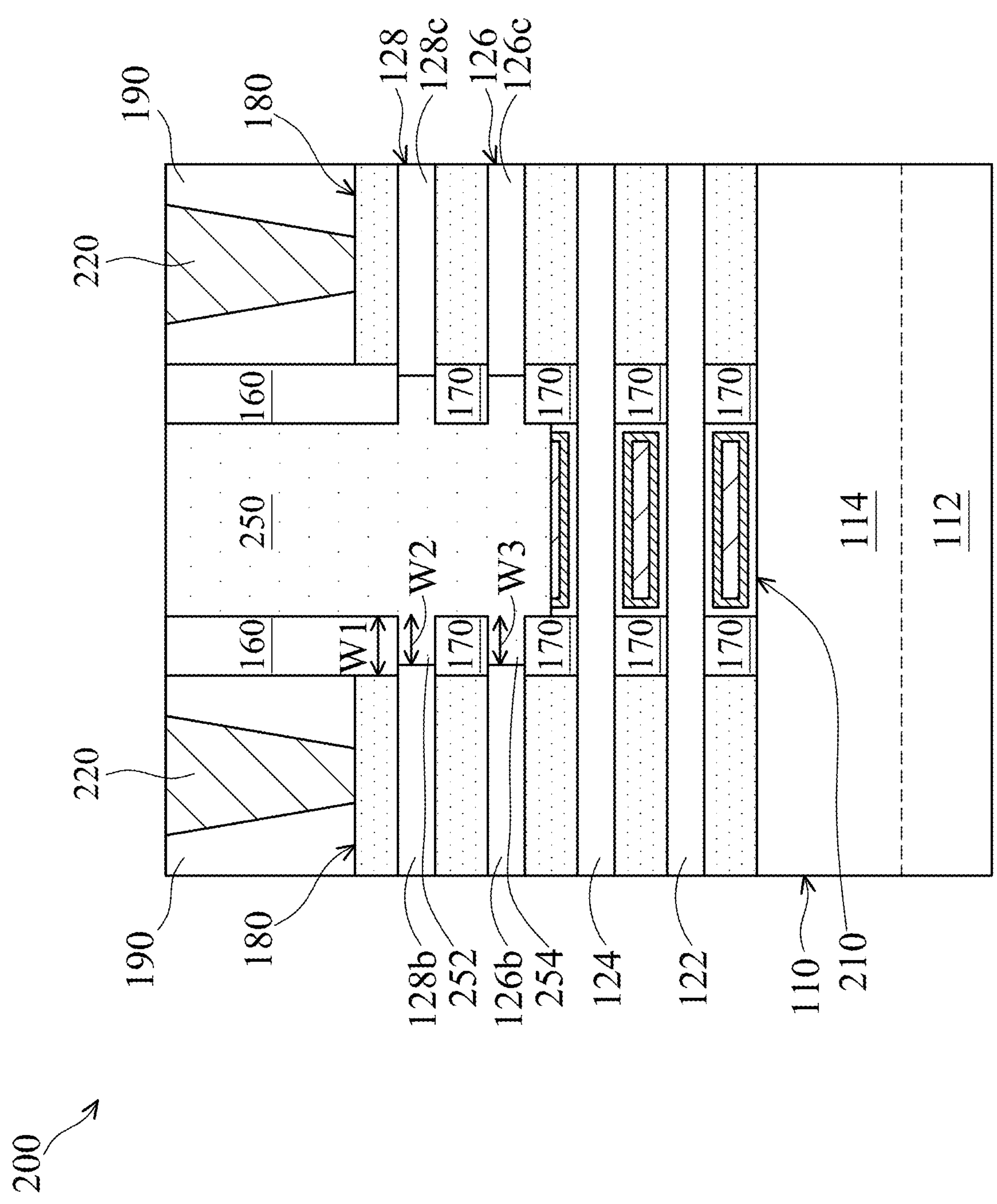
FIG. 2 is a cross-sectional view of a semiconductor device structure, in accordance with some embodiments.

FIG. 2 is a cross-sectional view of a semiconductor device structure 200, in accordance with some embodiments. As shown in FIG. 2, the semiconductor device structure 200 is similar to the semiconductor device structure 100 of FIG. 1N, except that the nanostructure 126 (including the portions 126*b* and 126*c*) extends into the inner spacer layer 170, and the nanostructure 128 (including the portions 128*b* and 128*c*) extends between the inner spacer layer 170 and the spacer structure 160, in accordance with some embodiments.

The width W2 of the extension portion 252 is less than the width W1 of the spacer structure 160, in accordance with some embodiments. The width W3 of the extension portion 254 is less than the width W1 of the spacer structure 160, in accordance with some embodiments. The width W2 of the extension portion 252 is substantially equal to the width W3 of the extension portion 254, in accordance with some embodiments.

In some embodiments, the width W2 of the extension portion 252 is less than the width W3 of the extension portion 254. In some other embodiments, the width W2 of the extension portion 252 is greater than the width W3 of the extension portion 254.

Figure 3:
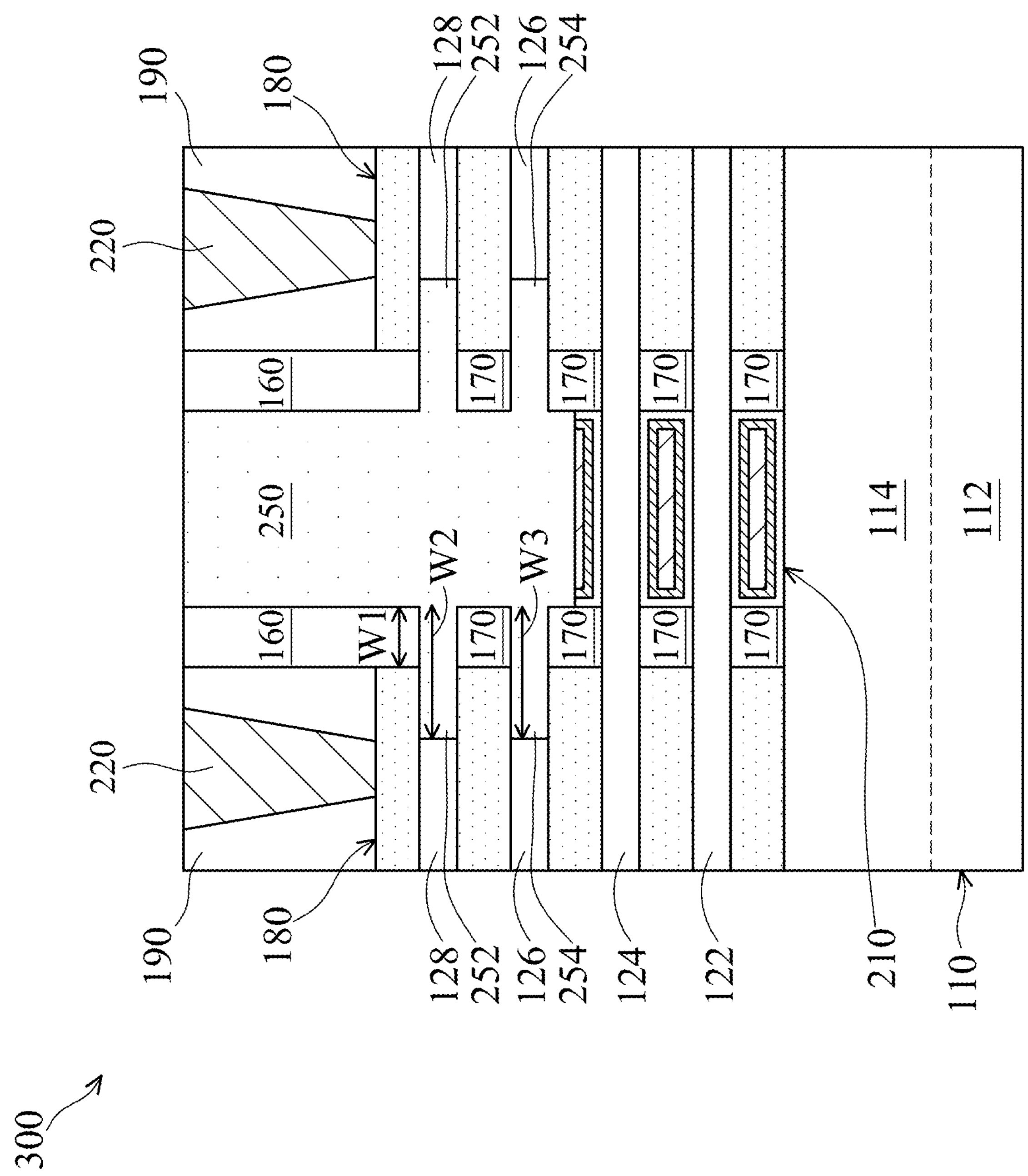
FIG. 3 is a cross-sectional view of a semiconductor device structure, in accordance with some embodiments.

FIG. 3 is a cross-sectional view of a semiconductor device structure 300, in accordance with some embodiments. As shown in FIG. 3, the semiconductor device structure 300 is similar to the semiconductor device structure 100 of FIG. 1N, except that the dielectric structure 250 extends into or penetrates into the source/drain structures 180, in accordance with some embodiments.

The extension portion 252 of the dielectric structure 250 is over the inner spacer layer 170 and extends into the source/drain structure 180, in accordance with some embodiments. The extension portion 254 of the dielectric structure 250 passes through the inner spacer layer 170 and extends into the source/drain structure 180, in accordance with some embodiments.

The width W2 of the extension portion 252 is greater than the width W1 of the spacer structure 160, in accordance with some embodiments. The width W3 of the extension portion 254 is greater than the width W1 of the spacer structure 160, in accordance with some embodiments. The width W2 of the extension portion 252 is substantially equal to the width W3 of the extension portion 254, in accordance with some embodiments.

In some embodiments, the width W2 of the extension portion 252 is less than the width W3 of the extension portion 254. In some other embodiments, the width W2 of the extension portion 252 is greater than the width W3 of the extension portion 254.

The formation of the semiconductor device structure 300 includes: performing the steps of FIGS. 1A-1K; removing the nanostructures 126 and 128 in or over the inner spacer layer 170 and in the source/drain structures 180; and performing the steps of FIGS. 1M-1N, in accordance with some embodiments.

Figure 4:
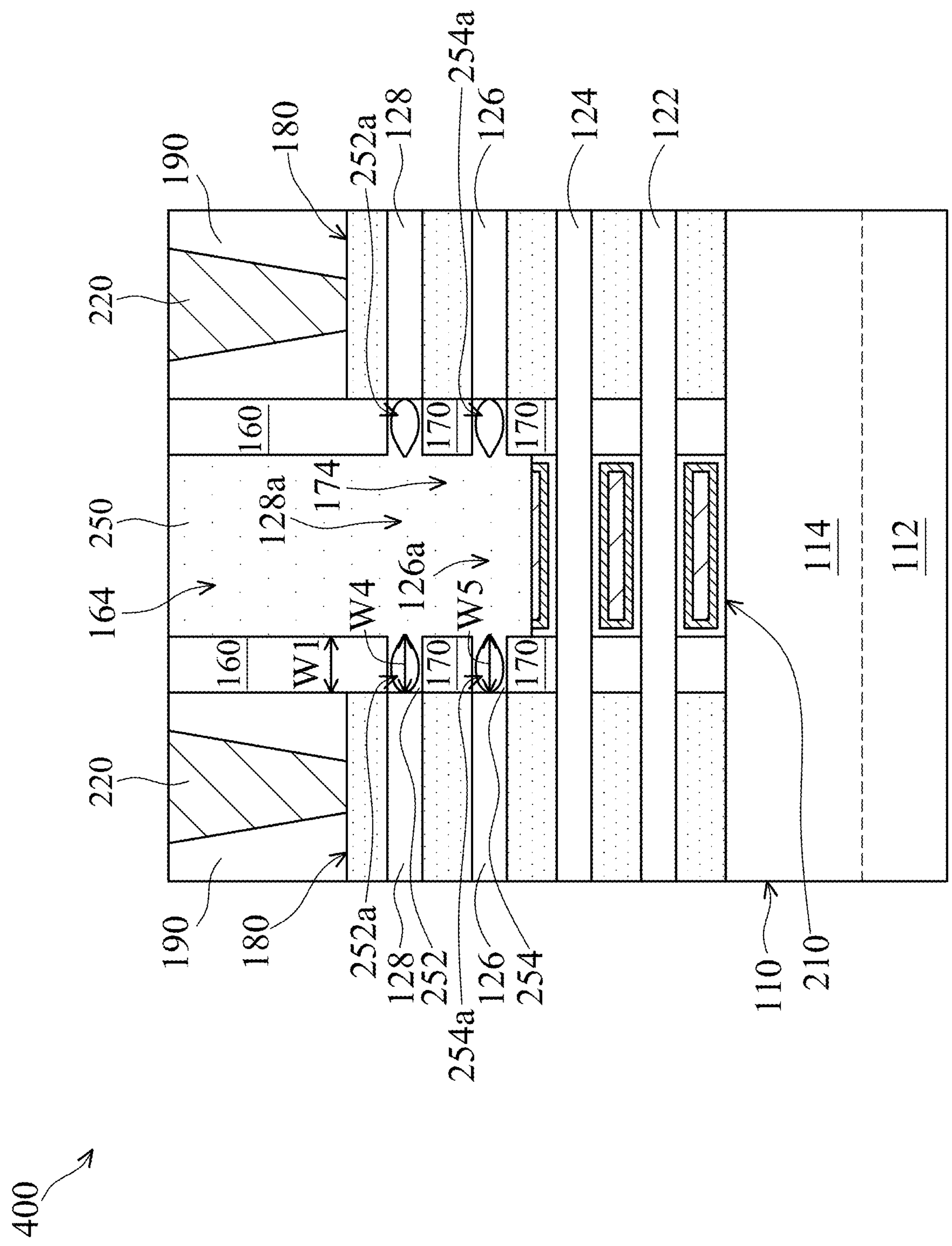
FIG. 4 is a cross-sectional view of a semiconductor device structure, in accordance with some embodiments.

FIG. 4 is a cross-sectional view of a semiconductor device structure 400, in accordance with some embodiments. As shown in FIG. 4, the semiconductor device structure 400 is similar to the semiconductor device structure 100 of FIG. 1N, except that the dielectric structure 250 has voids 252*a* and 254*a* in the trenches 128*a* and 126*a* of the nanostructures 128 and 126, in accordance with some embodiments.

The voids 252*a* are positioned in the extension portions 252, in accordance with some embodiments. The voids 254*a* are positioned in the extension portions 254, in accordance with some embodiments. The voids 252*a* and 254*a* are filled with air, in accordance with some embodiments. In some other embodiments, the voids 252*a* and 254*a* are filled with gas such as inert gas, nitrogen or another suitable gas.

Since the (relative) dielectric constant of air or gases is low (about 1), the formation of the voids 252*a* and 254*a* decreases the dielectric constant of the dielectric structure 250 between the gate stack 210 and the nanostructures 128 and 126, in accordance with some embodiments. Therefore, the formation of the voids 252*a* and 254*a* decreases the parasitic capacitance between the gate stack 210 and the nanostructures 128 and 126, in accordance with some embodiments. As a result, the performance of the semiconductor device structure 400 is improved, in accordance with some embodiments.

The width W4 of the void 252*a* is substantially equal to the width W1 of the spacer structure 160, in accordance with some embodiments. The width W5 of the void 254*a* is substantially equal to the width W1 of the spacer structure 160, in accordance with some embodiments.

The dielectric structure 250 is formed using a deposition process (e.g., a chemical vapor deposition process) and a planarization process (e.g., a chemical mechanical polishing process), in accordance with some embodiments. The deposition rate of the deposition process (e.g., a chemical vapor deposition process) for forming the dielectric structure 250 of FIG. 4 is greater than the deposition rate of the deposition process (e.g., an atomic layer deposition process) for forming the dielectric structure 250 of FIG. 1N, in accordance with some embodiments.

Figure 5:
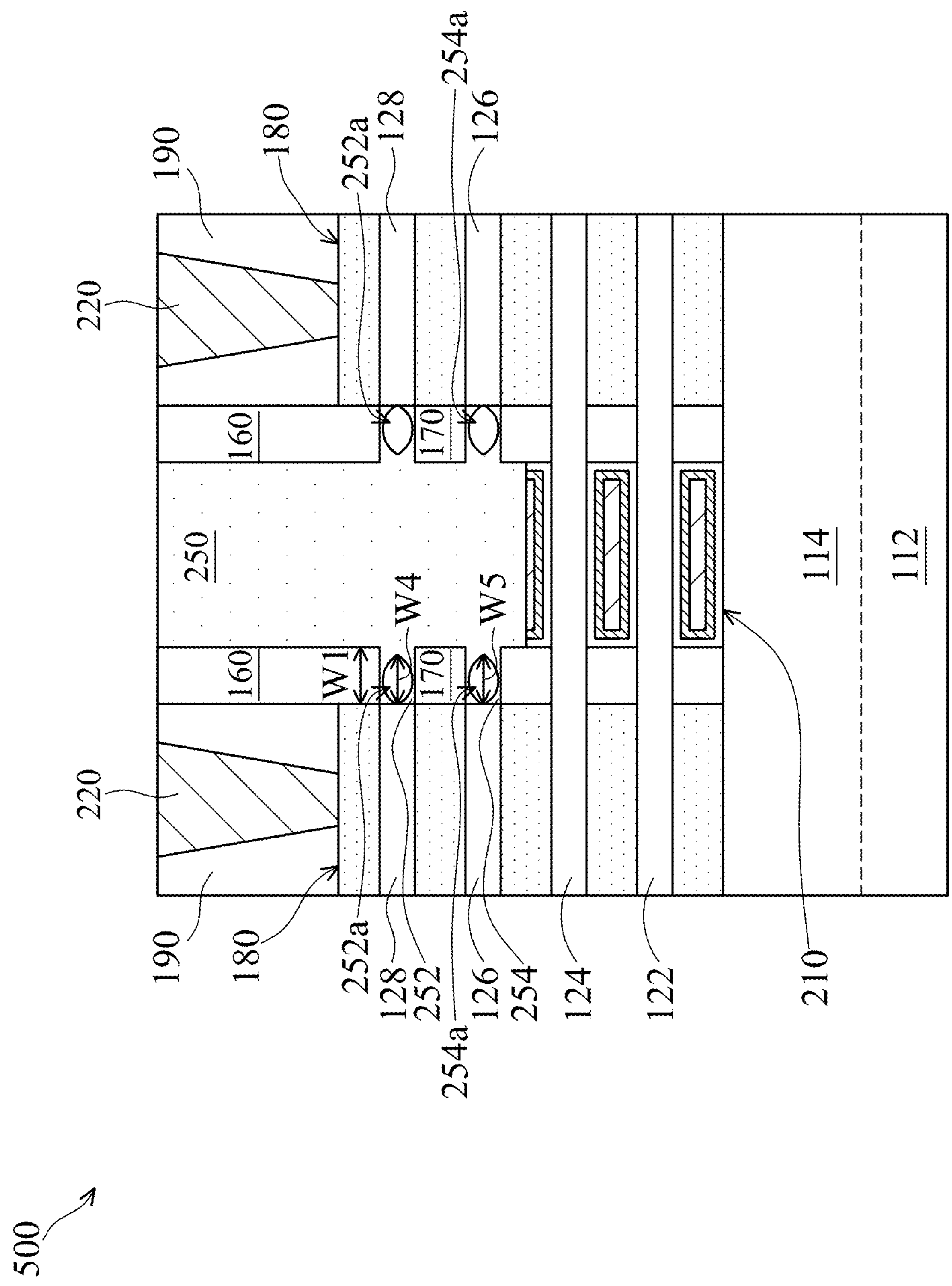
FIG. 5 is a cross-sectional view of a semiconductor device structure, in accordance with some embodiments.

FIG. 5 is a cross-sectional view of a semiconductor device structure 500, in accordance with some embodiments. As shown in FIG. 5, the semiconductor device structure 500 is similar to the semiconductor device structure 400 of FIG. 4, except that, in the semiconductor device structure 500, the width W4 of the void 252*a* or the width W5 of the void 254*a* is less than the width W1 of the spacer structure 160, in accordance with some embodiments.

Figure 6:
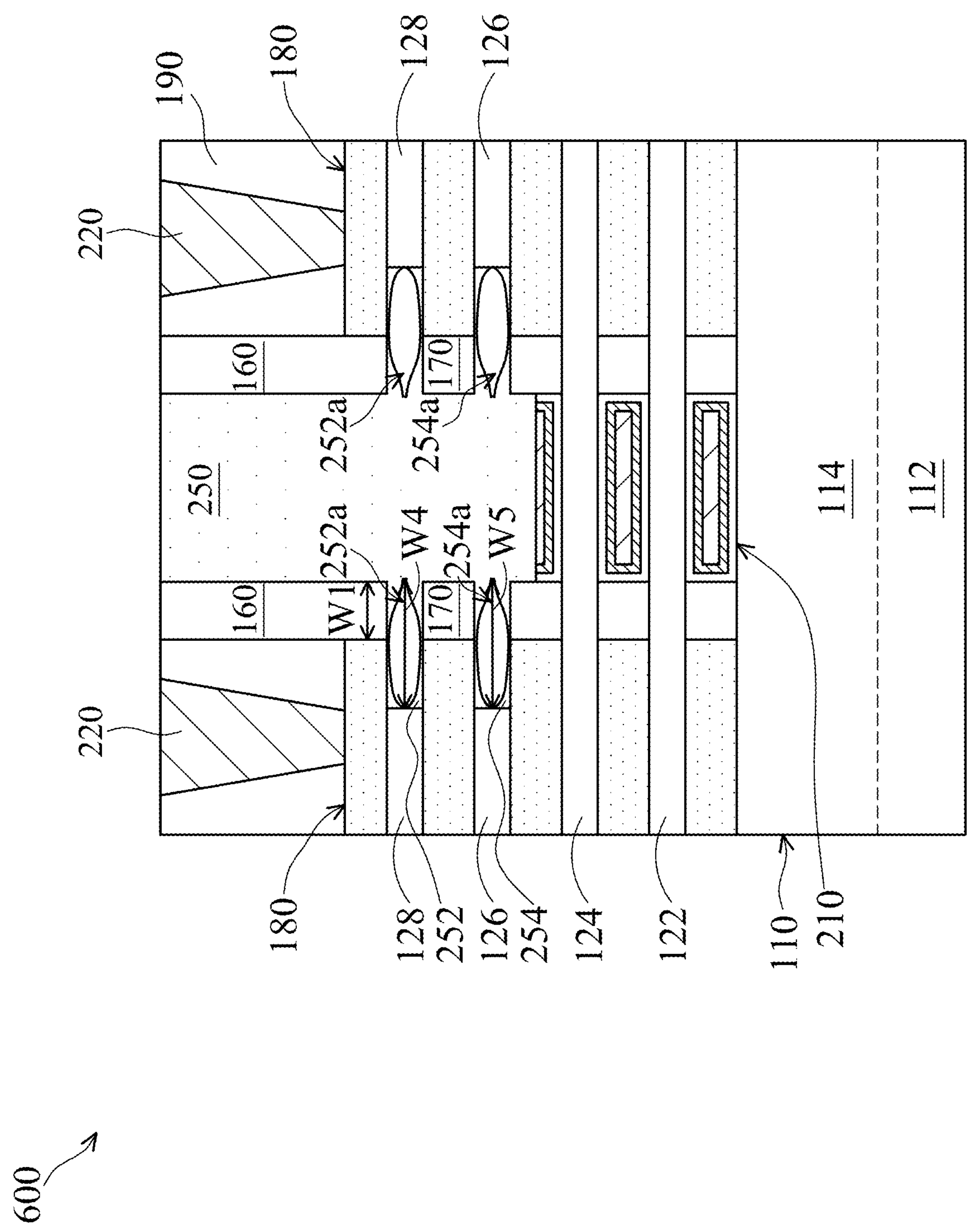
FIG. 6 is a cross-sectional view of a semiconductor device structure, in accordance with some embodiments.

FIG. 6 is a cross-sectional view of a semiconductor device structure 600, in accordance with some embodiments. As shown in FIG. 6, the semiconductor device structure 600 is similar to the semiconductor device structure 300 of FIG. 3 and the semiconductor device structure 400 of FIG. 4, except that, in the semiconductor device structure 600, the width W4 of the void 252*a* or the width W5 of the void 254*a* is greater than the width W1 of the spacer structure 160, in accordance with some embodiments. The voids 252*a* and 254*a* extend into the source/drain structures 180, in accordance with some embodiments.

Figure 7A:
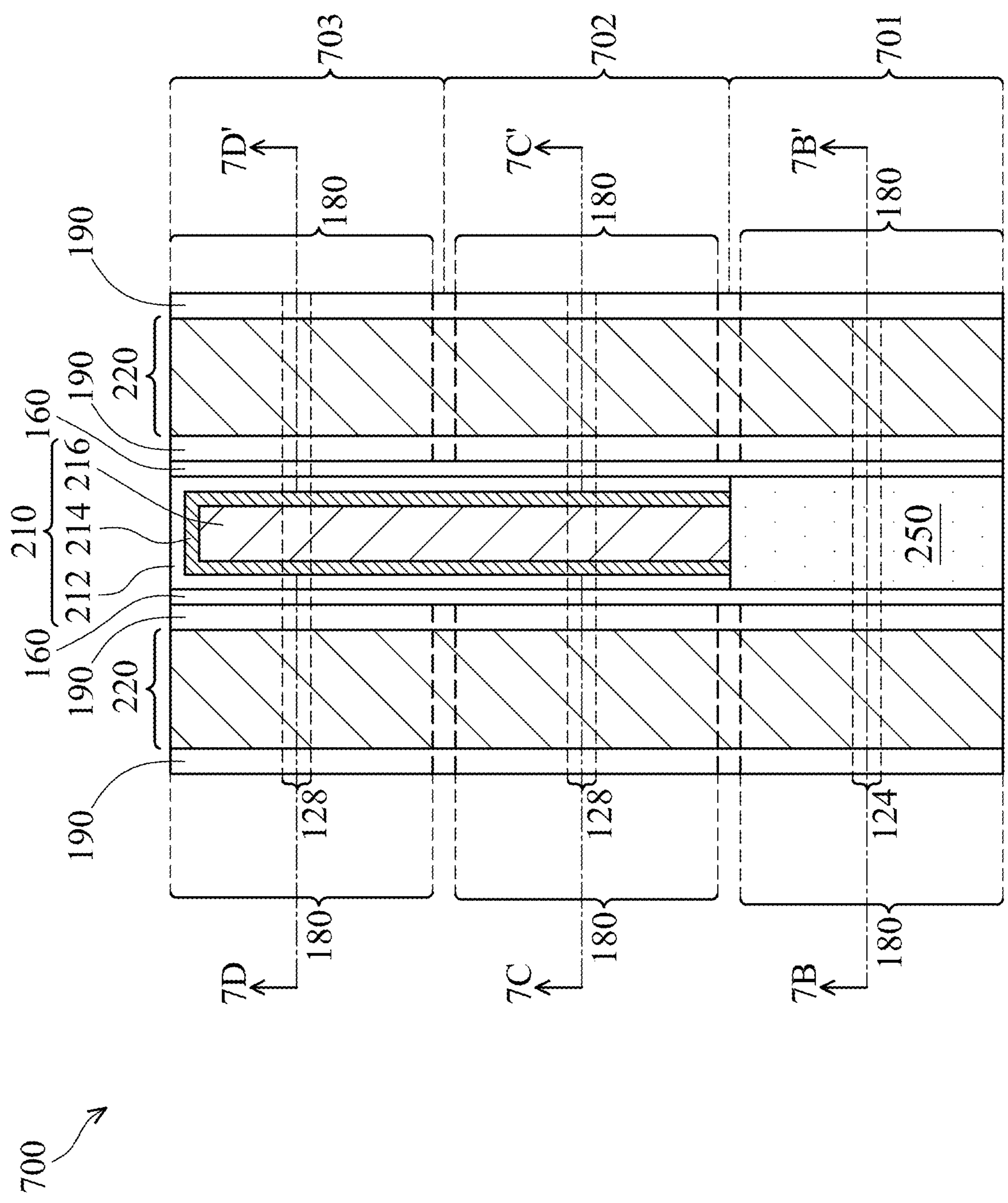
FIG. 7A is a top view of a semiconductor device structure, in accordance with some embodiments.
Figure 7B:
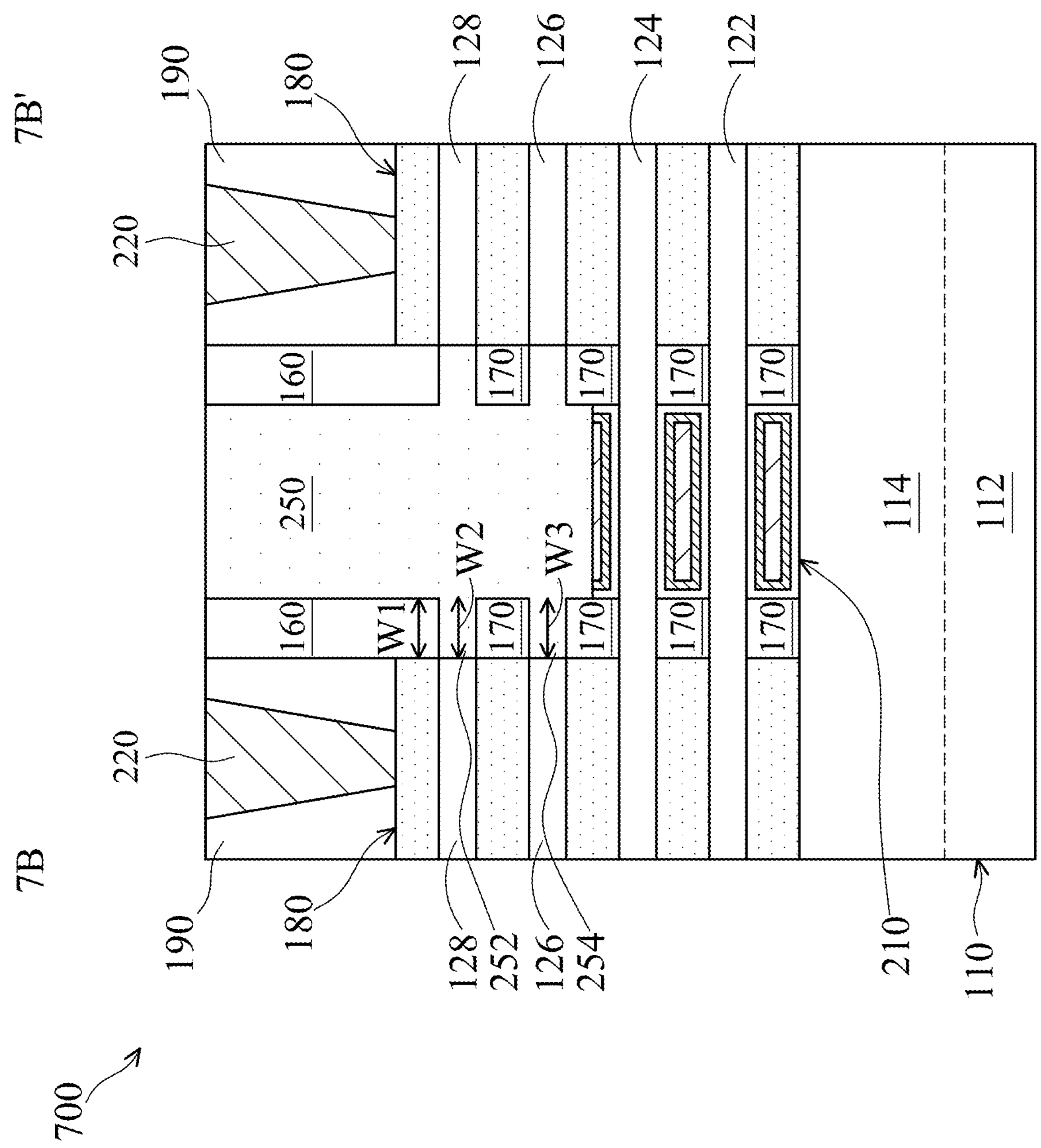
FIG. 7B is a cross-sectional view illustrating the semiconductor device structure along a sectional line 7B-7B' in FIG. 7A, in accordance with some embodiments.
Figure 7C:
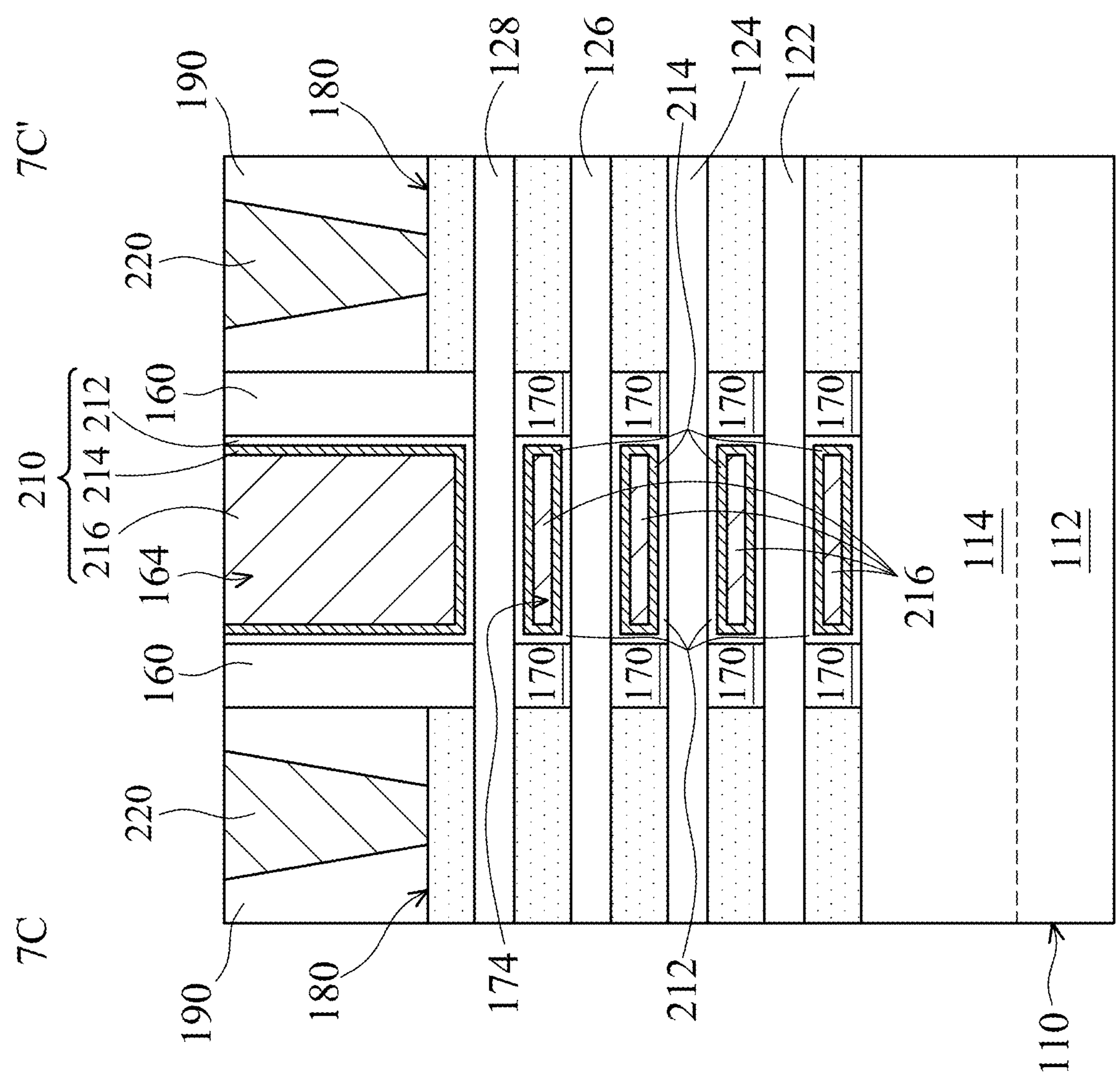
FIG. 7C is a cross-sectional view illustrating the semiconductor device structure along a sectional line 7C-7C' in FIG. 7A, in accordance with some embodiments.
Figure 7D:
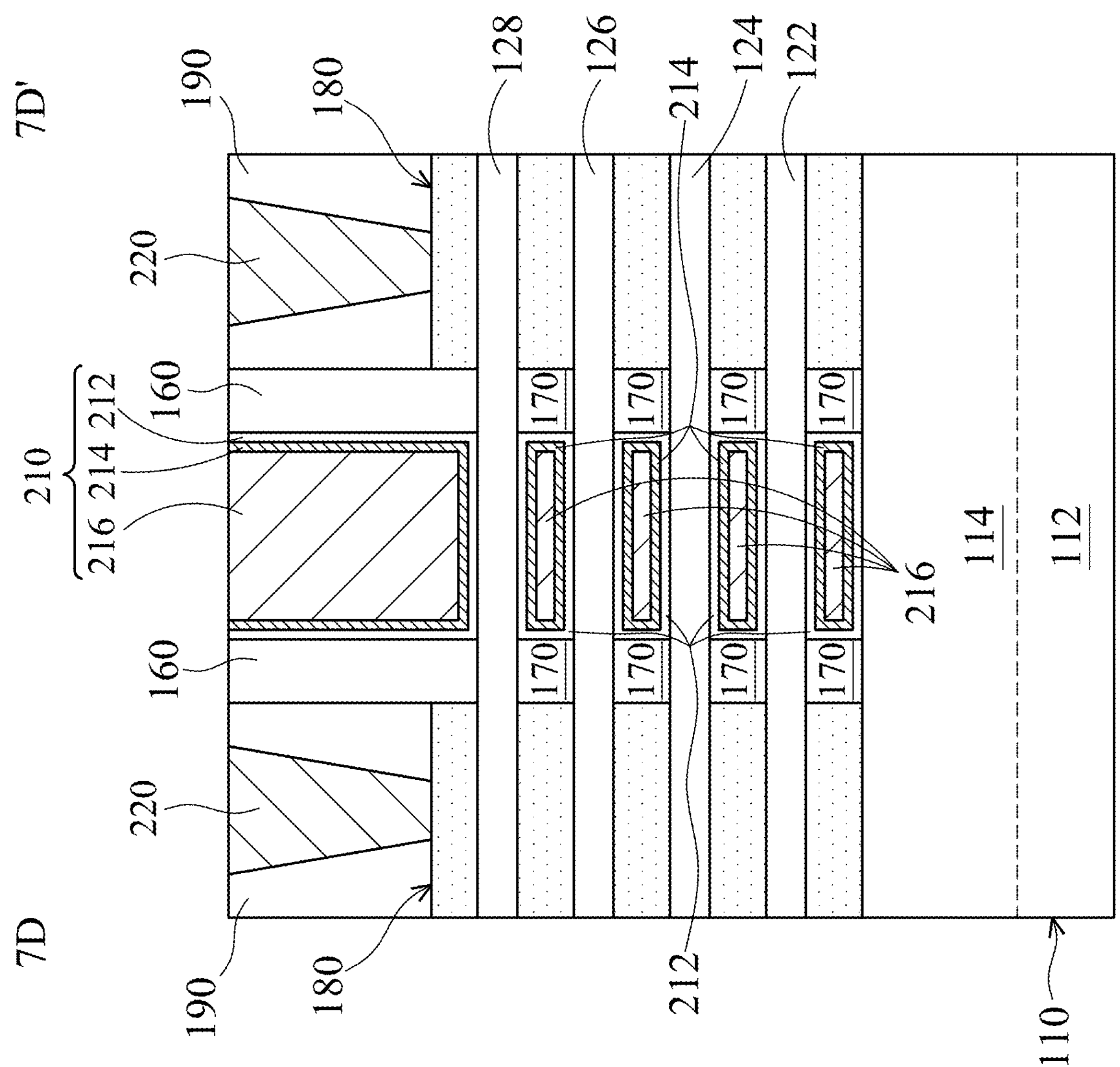
FIG. 7D is a cross-sectional view illustrating the semiconductor device structure along a sectional line 7D-7D' in FIG. 7A, in accordance with some embodiments.

FIG. 7A is a top view of a semiconductor device structure 700, in accordance with some embodiments. FIG. 7B is a cross-sectional view illustrating the semiconductor device structure 700 along a sectional line 7B-7B' in FIG. 7A, in accordance with some embodiments. FIG. 7C is a cross-sectional view illustrating the semiconductor device structure 700 along a sectional line 7C-7C' in FIG. 7A, in accordance with some embodiments. FIG. 7D is a cross-sectional view illustrating the semiconductor device structure 700 along a sectional line 7D-7D' in FIG. 7A, in accordance with some embodiments.

As shown in FIG. 7A, the semiconductor device structure 700 has parts 701, 702 and 703, in accordance with some embodiments. The parts 701, 702 and 703 are connected to each other, in accordance with some embodiments. As shown in FIGS. 7A and 7B, the part 701 is similar to or the same as the semiconductor device structure 100 of FIG. 1N, in accordance with some embodiments.

As shown in FIGS. 7A and 7C, the part 702 is similar to or the same as the semiconductor device structure of FIG. 1F, in accordance with some embodiments. As shown in FIGS. 7A and 7D, the part 703 is similar to or the same as the semiconductor device structure of FIG. 1F, in accordance with some embodiments.

As shown in FIGS. 7A, 7B, 7C and 7D, the part 701 has two channel nanostructures (i.e., the nanostructures 122 and 124), and the part 702 or 703 has four channel nanostructures (i.e., the nanostructures 122, 124, 126 and 128), in accordance with some embodiments. That is, the number of the channel nanostructures in different parts of the semiconductor device structure 700 may be varied according to different requirements, in accordance with some embodiments.

Figure 8:
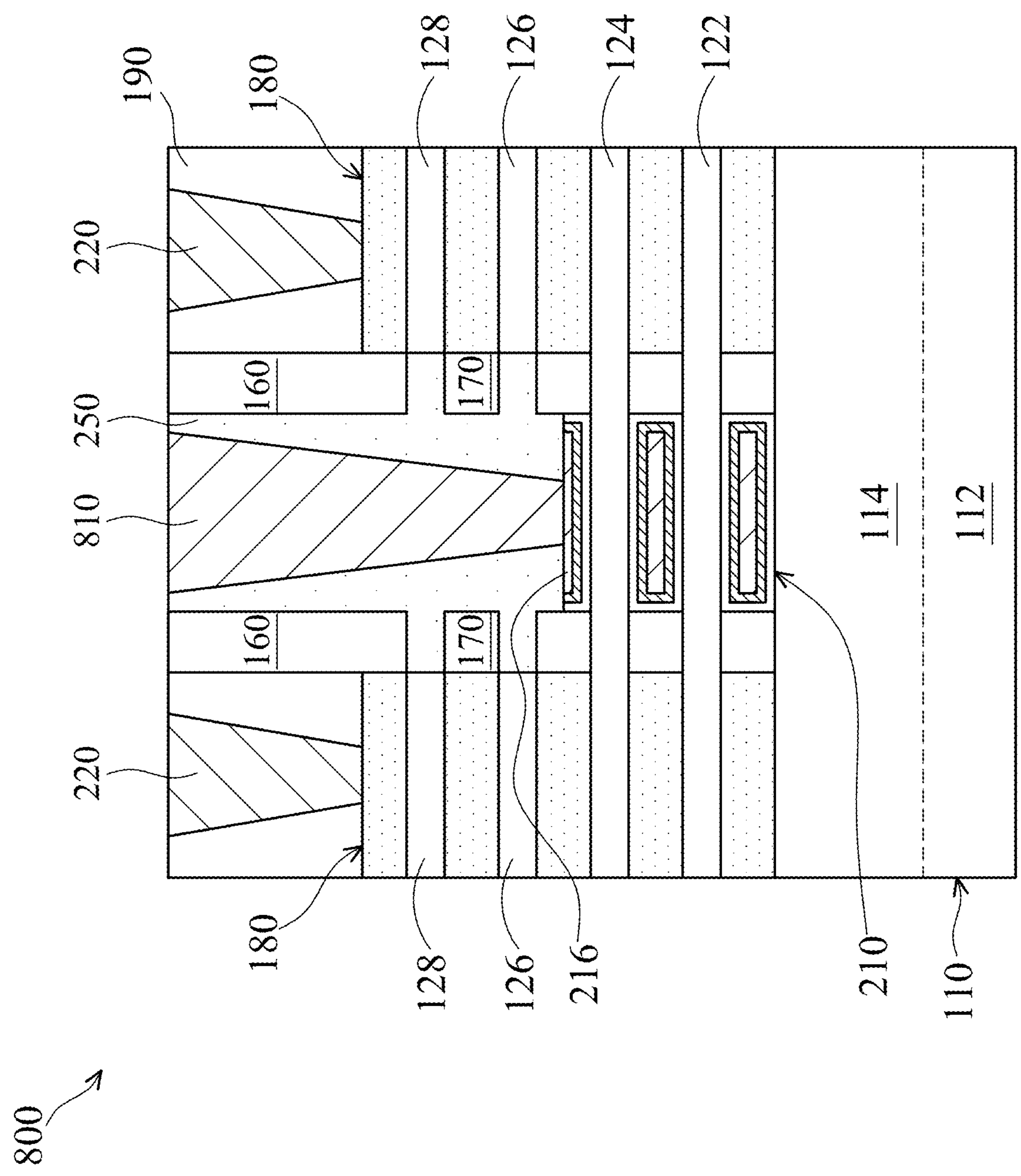
FIG. 8 is a cross-sectional view of a semiconductor device structure, in accordance with some embodiments.

FIG. 8 is a cross-sectional view of a semiconductor device structure 800, in accordance with some embodiments. As shown in FIG. 8, the semiconductor device structure 800 is similar to the semiconductor device structure 100 of FIG. 1N, except that the semiconductor device structure 800 further has a contact structure 810, in accordance with some embodiments.

The contact structure 810 passes through the dielectric structure 250 and the nanostructures 126 and 128, in accordance with some embodiments. The contact structure 810 is electrically connected to the gate stack 210, in accordance with some embodiments. The contact structure 810 is in direct contact with the gate stack 210, in accordance with some embodiments. The contact structure 810 is made of metal (e.g., tungsten, aluminum, or copper), alloys thereof, or the like, in accordance with some embodiments.

The contact structures 810 are formed using a deposition process (e.g., a physical vapor deposition process or a chemical vapor deposition process) and a planarization process (e.g., a chemical mechanical polishing process), in accordance with some embodiments.

Figure 9:
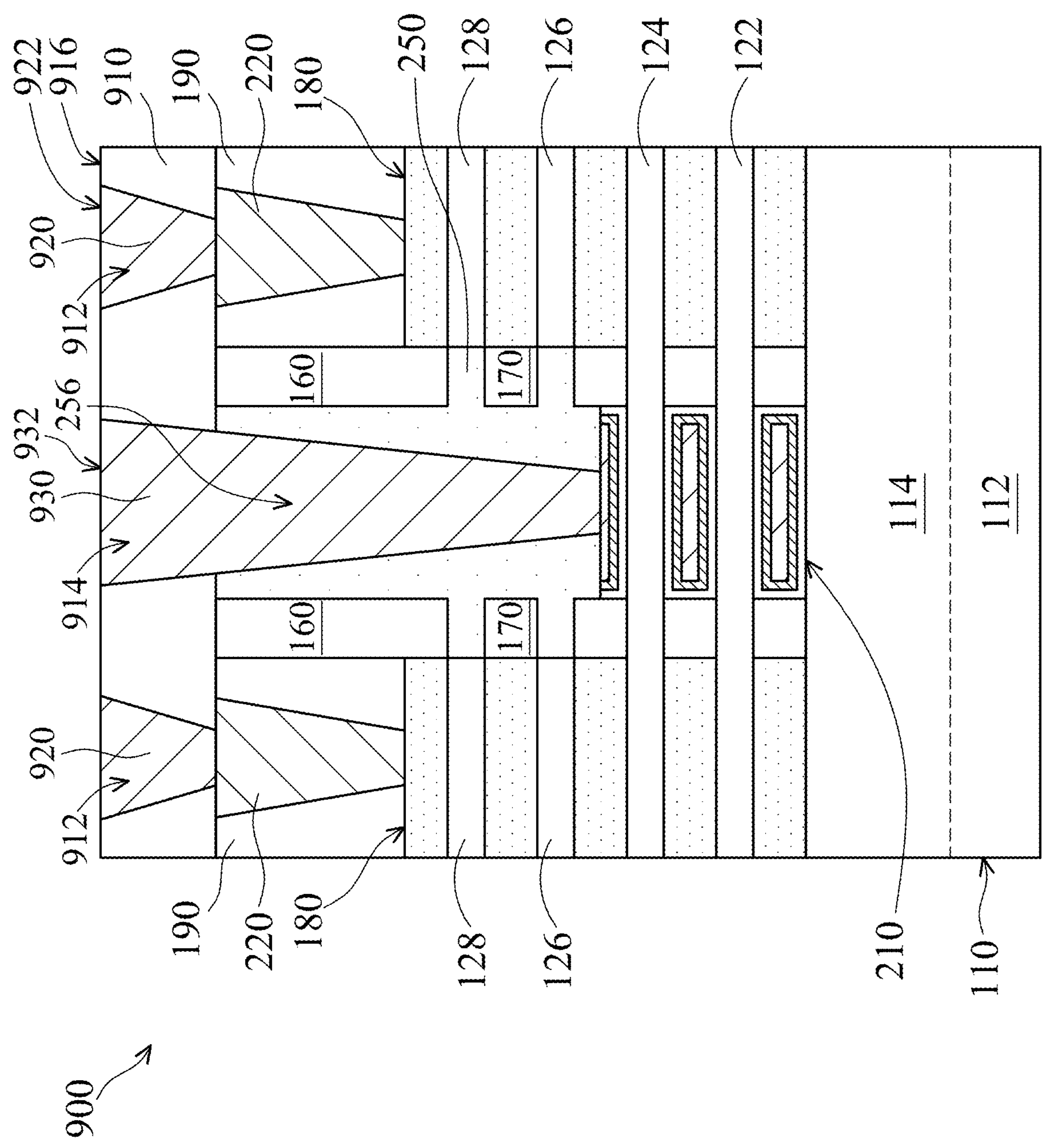
FIG. 9 is a cross-sectional view of a semiconductor device structure, in accordance with some embodiments.

FIG. 9 is a cross-sectional view of a semiconductor device structure 900, in accordance with some embodiments. As shown in FIG. 9, the semiconductor device structure 900 is similar to the semiconductor device structure 100 of FIG. 1N, except that the semiconductor device structure 900 further has a dielectric layer 910 and contact structures 920 and 930, in accordance with some embodiments.

The dielectric layer 910 is formed over the dielectric layer 190, the contact structures 220, the spacer structure 160, and the dielectric structure 250, in accordance with some embodiments. The dielectric layer 910 includes a dielectric material such as an oxide-containing material (e.g., silicon oxide), an oxynitride-containing material (e.g., silicon oxynitride), a low-k material, a porous dielectric material, glass, or a combination thereof, in accordance with some embodiments.

The glass includes borosilicate glass (BSG), phosphoric silicate glass (PSG), borophosphosilicate glass (BPSG), fluorinated silicate glass (FSG), or a combination thereof, in accordance with some embodiments. The dielectric layer 910 is formed by a deposition process (e.g., a chemical vapor deposition process), in accordance with some embodiments.

The contact structures 920 pass through the dielectric layer 910, in accordance with some embodiments. The contact structures 920 are electrically connected to the contact structures 220 thereunder, in accordance with some embodiments. The contact structures 920 are in direct contact with the contact structures 220 thereunder, in accordance with some embodiments. The contact structures 920 are made of metal (e.g., tungsten, aluminum, or copper), alloys thereof, or the like, in accordance with some embodiments.

The contact structure 930 passes through the dielectric layer 910, the dielectric structure 250 and the nanostructures 126 and 128, in accordance with some embodiments. The contact structure 930 is electrically connected to the gate stack 210, in accordance with some embodiments. The contact structure 930 is in direct contact with the gate stack 210, in accordance with some embodiments.

In some embodiments, top surfaces 916, 922 and 932 of the dielectric layer 910 and the contact structures 920 and 930 are substantially coplanar. The contact structure 930 is made of metal (e.g., tungsten, aluminum, or copper), alloys thereof, or the like, in accordance with some embodiments.

The formation of the contact structures 920 and 930 includes: removing portions of the dielectric layer 910 to form through holes 912 and 914 over the contact structures 220 and the dielectric structure 250; removing a portion of the dielectric structure 250 to form a through hole 256 in the dielectric structure 250; depositing a conductive layer (not shown) in the through holes 912, 914 and 256 and over the dielectric layer 910; and removing the conductive layer outside of the through holes 912, 914 and 256, in accordance with some embodiments.

Figure 10A:
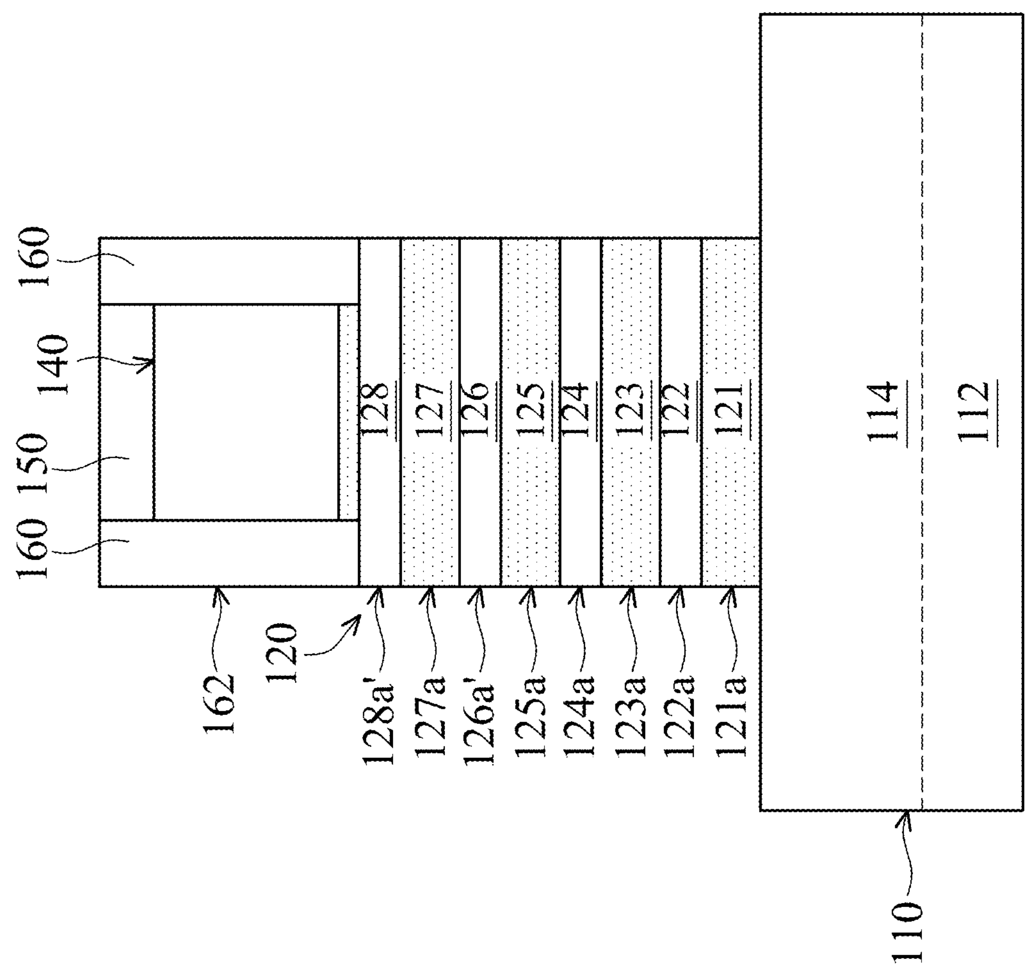
FIGS. 10A-10G are cross-sectional views of various stages of a process for forming a semiconductor device structure, in accordance with some embodiments.

FIGS. 10A-10G are cross-sectional views of various stages of a process for forming a semiconductor device structure, in accordance with some embodiments. After the step of FIG. 1A, as shown in FIG. 10A, end portions of the nanostructures 121, 122, 123, 124, 125, 126, 127, and 128, which are not covered by the gate stack 140 and the spacer structure 160, are removed, in accordance with some embodiments.

As shown in FIG. 10A, sidewalls 121*a*, 122*a*, 123*a*, 124*a*, 125*a*, 126*a*', 127*a*, and 128*a*' of the nanostructures 121, 122, 123, 124, 125, 126, 127, and 128 are substantially aligned with (or substantially coplanar with) sidewalls 162 of the spacer structure 160, in accordance with some embodiments. The removal process includes an etching process, in accordance with some embodiments. The etching process includes an anisotropic etching process such as a dry etching process, in accordance with some embodiments.

Figure 10B:
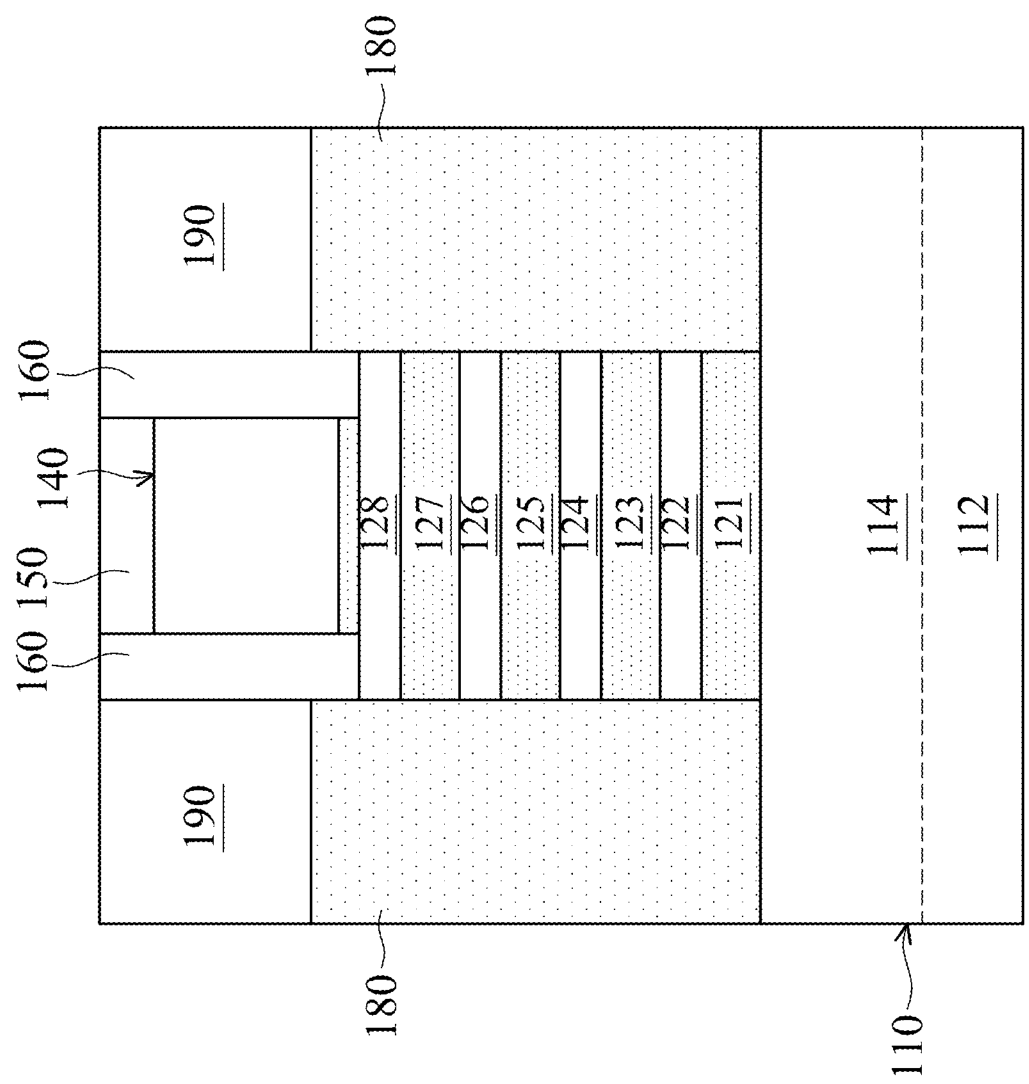
Figure 10C:
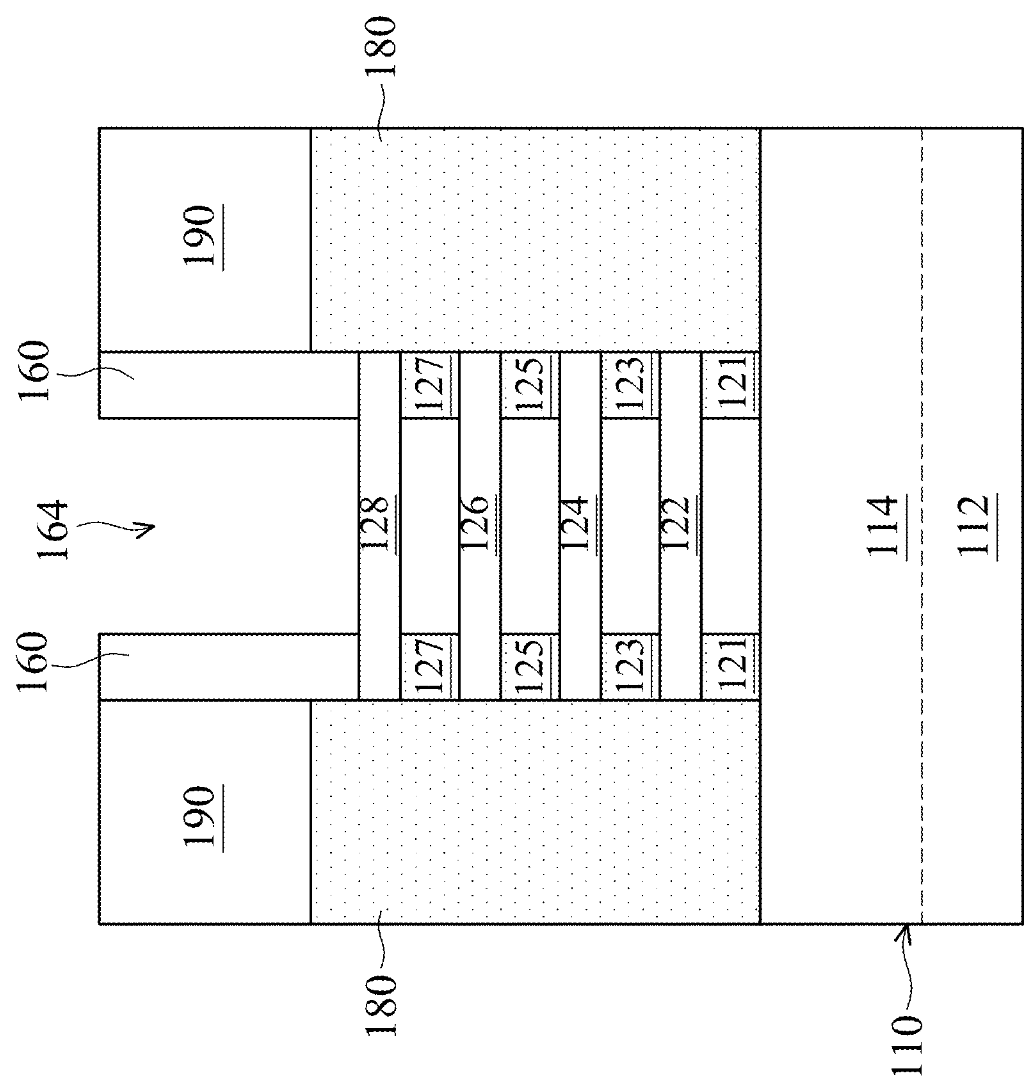

As shown in FIG. 10B, the step of FIG. 1D is performed to form source/drain structures 180 and a dielectric layer 190 over the substrate 110, in accordance with some embodiments. As shown in FIGS. 10B and 10C, the gate stack 140 and the mask layer 150 are removed, in accordance with some embodiments. The removal process forms a trench 164 in the spacer structure 160, in accordance with some embodiments. As shown in FIG. 10C, portions of the nanostructures 121, 123, 125 and 127 under the trench 164 are removed, in accordance with some embodiments. The removal process includes an anisotropic etching process, such as a dry etching process, in accordance with some embodiments.

Figure 10D:
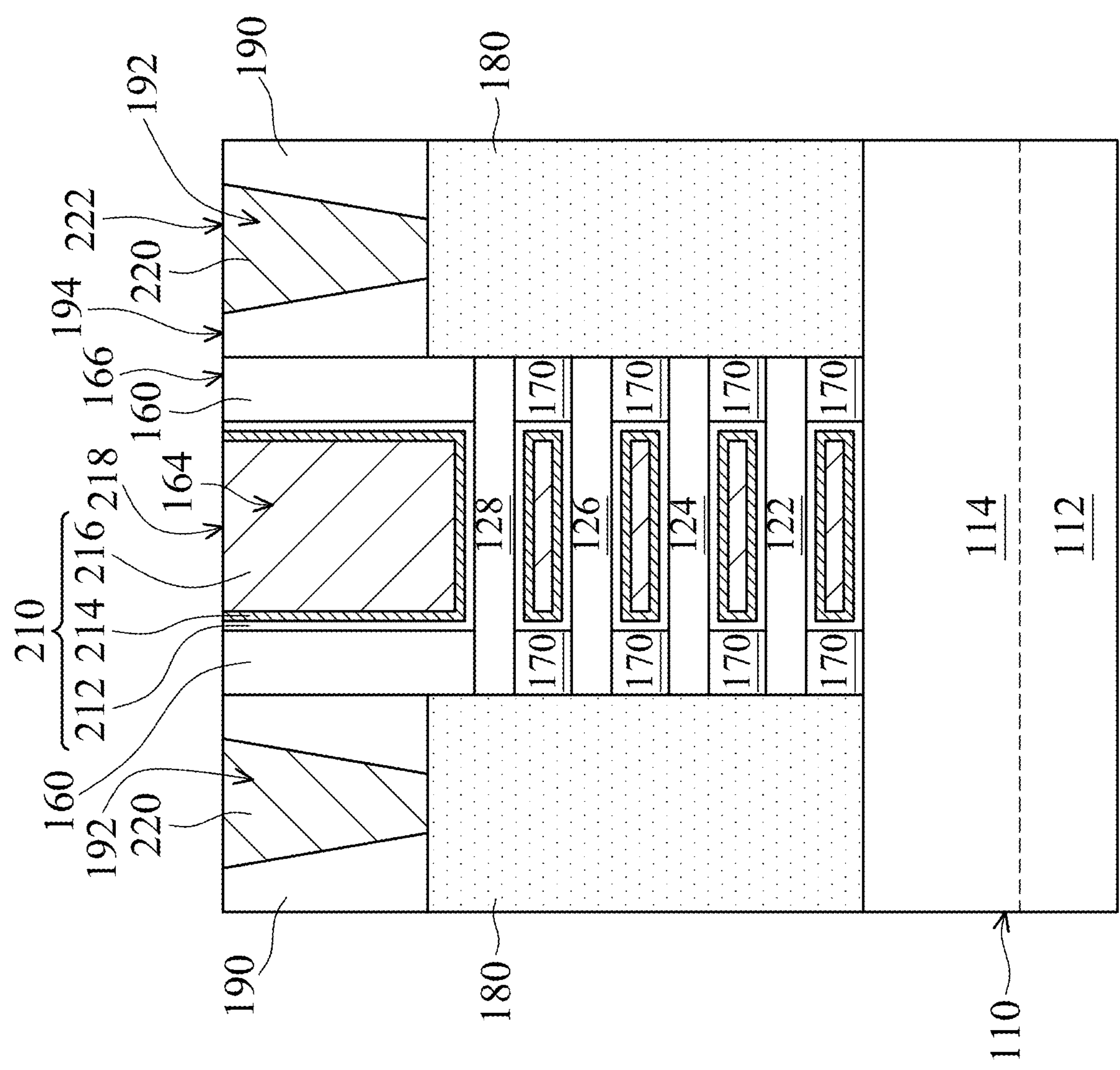

As shown in FIG. 10D, the remaining nanostructures 121, 123, 125 and 127 are oxidized to form an inner spacer layer 170, in accordance with some embodiments. Thereafter, as shown in FIG. 10D, the step of FIG. 1E is performed to form a gate stack 210 in the trench 164 and surrounding the nanostructures 122, 124, 126, and 128, in accordance with some embodiments. Afterwards, as shown in FIG. 10D, the step of FIG. 1F is performed to form contact structures 220 in the dielectric layer 190, in accordance with some embodiments.

Figure 10E:
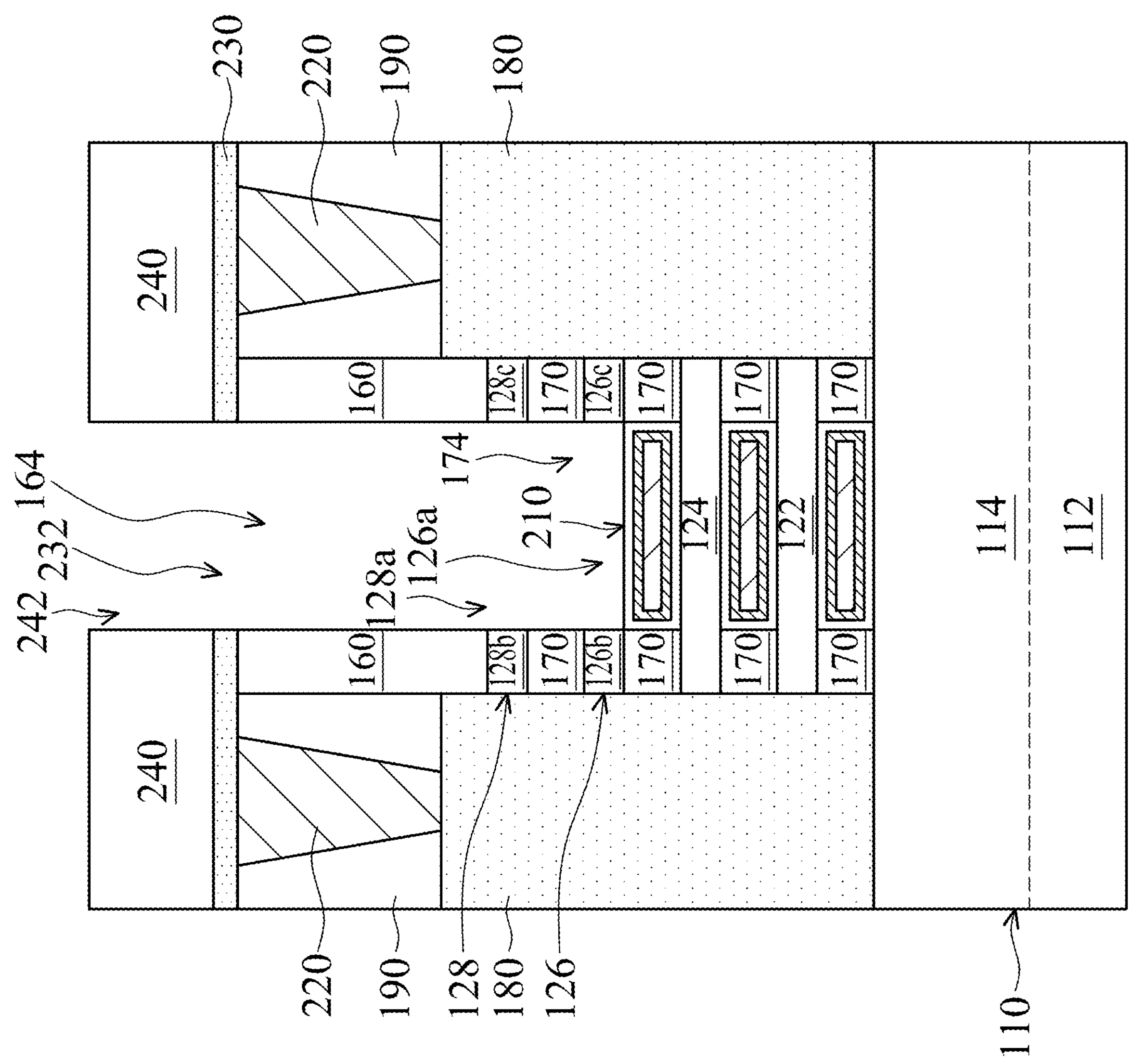

As shown in FIGS. 10D and 10E, the steps of FIGS. 1G-1K are performed to form an anti-reflection layer 230 and a mask layer 240 over the dielectric layer 190, the contact structures 220, and the spacer structure 160 and to sequentially remove the gate stack 210 in the trench 164, the nanostructure 128 under the trench 164, the gate stack 210 between the nanostructures 126 and 128, and the nanostructure 126 under the trench 164, in accordance with some embodiments. The removal process forms trenches 128*a*, 174, and 126*a* respectively in the nanostructure 128, the inner spacer layer 170 and the nanostructure 126, in accordance with some embodiments. The trenches 126*a*, 174, and 128*a* communicate with the trench 164, in accordance with some embodiments.

The nanostructure 126 is divided into portions 126*b* and 126*c* by the trench 126*a*, in accordance with some embodiments. The portions 126*b* and 126*c* are spaced apart from each other, in accordance with some embodiments. The nanostructure 128 is divided into portions 128*b* and 128*c* by the trench 128*a*, in accordance with some embodiments. The portions 128*b* and 128*c* are spaced apart from each other, in accordance with some embodiments.

Figure 10F:
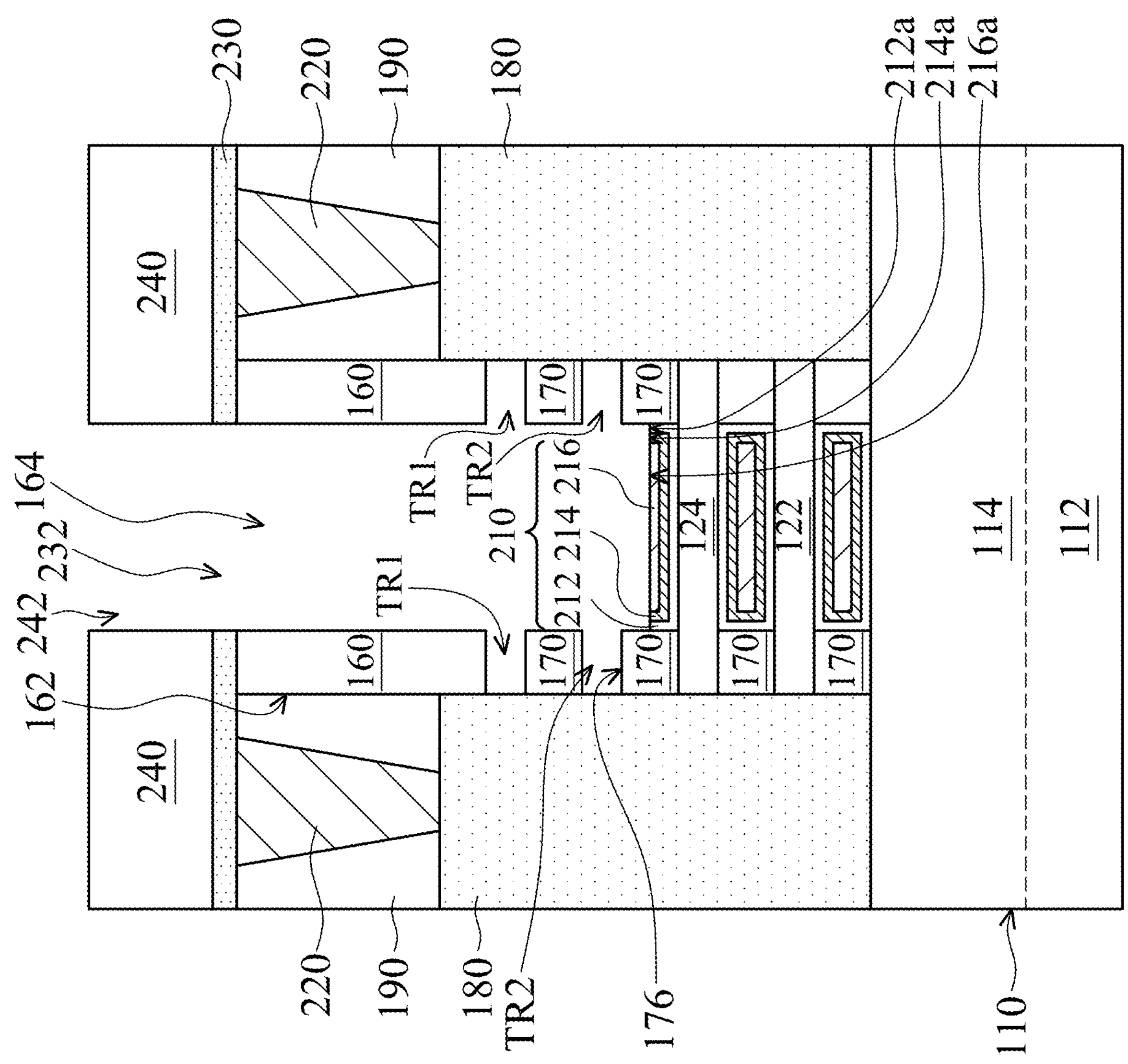

As shown in FIGS. 10E and 10F, portions 126*b*, 126*c*, 128*b* and 128*c* are removed through the trench 164 of the spacer structure 160, in accordance with some embodiments. The nanostructures 126 and 128 are completely removed in this step, in accordance with some embodiments. In some embodiments, trenches TR1 between the spacer structure 160 and the inner spacer layer 170 and trenches TR2 in the inner spacer layer 170 are formed after the portions 126*b*, 126*c*, 128*b* and 128*c* are removed.

Figure 10G:
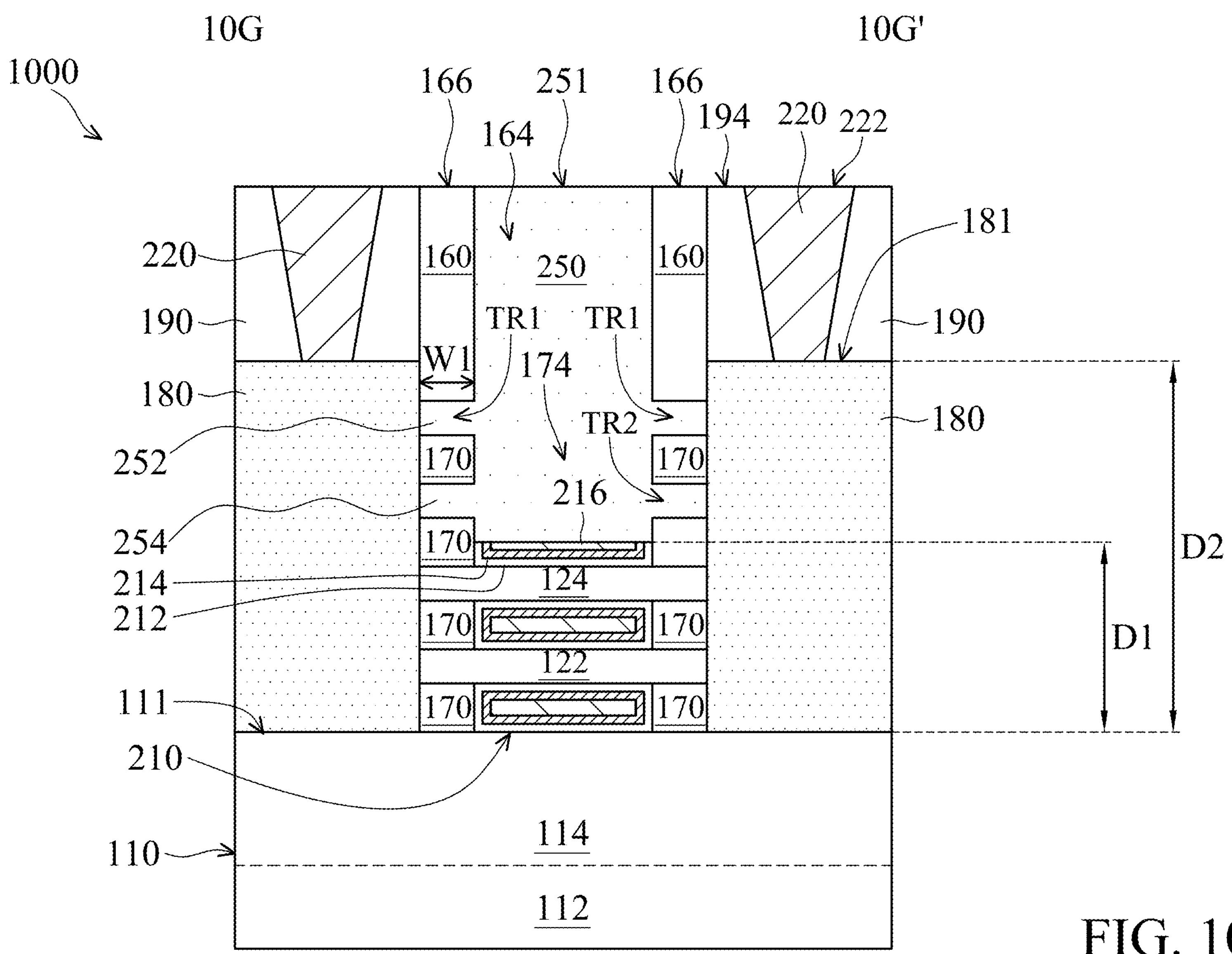
Figures 1, 10G:
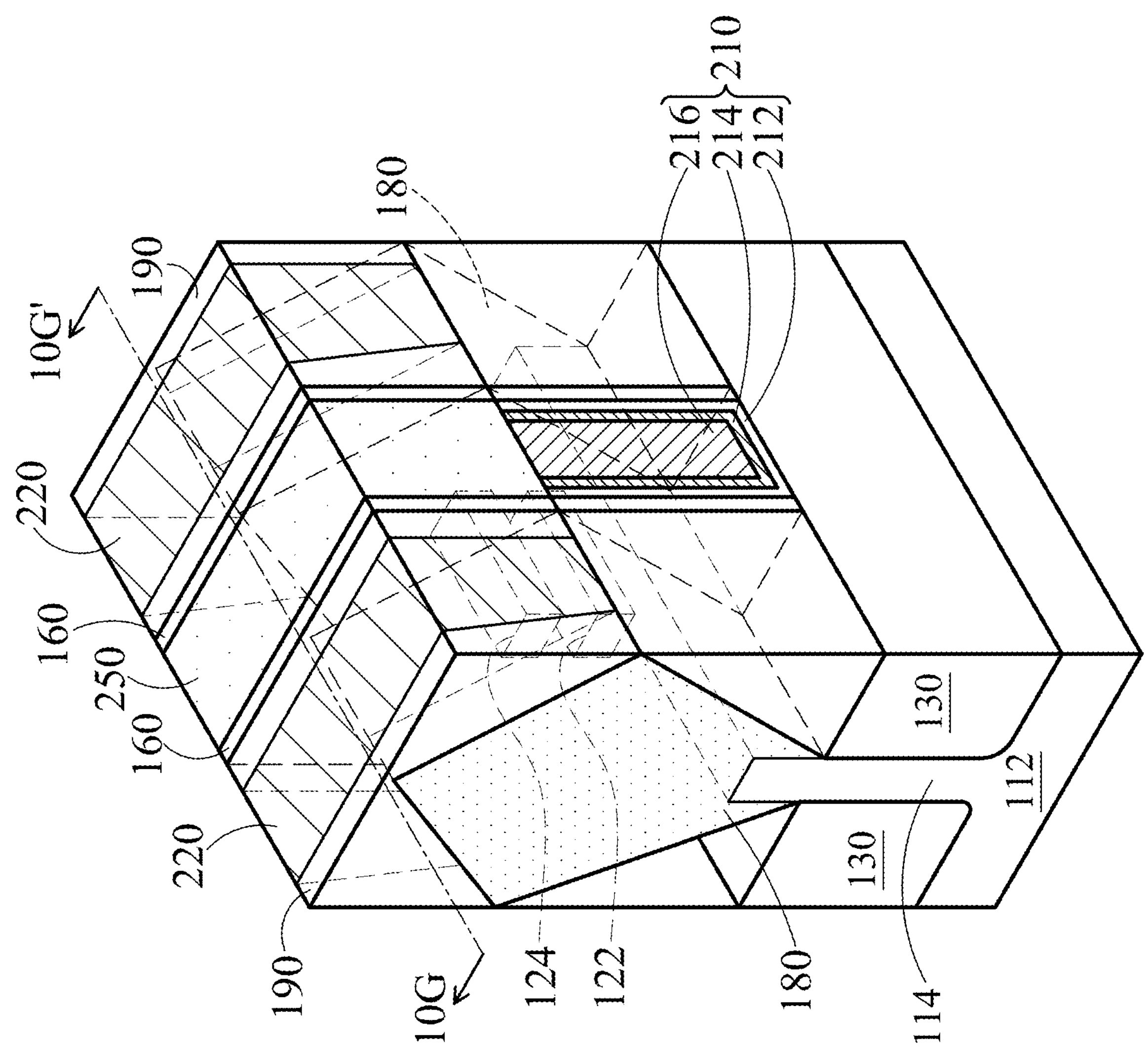

FIG. 10G-1 is a perspective view of the semiconductor device structure of FIG. 10G, in accordance with some embodiments. As shown in FIGS. 10G and 10G-1, the steps of FIGS. 1M and 1N are performed to remove the anti-reflection layer 230 and the mask layer 240 and to form a dielectric structure 250 in the trenches 164, 174, TR1 and TR2, in accordance with some embodiments. The dielectric structure 250 is in direct contact with the source/drain structures 180, in accordance with some embodiments. In this step, a semiconductor device structure 1000 is substantially formed, in accordance with some embodiments.

The removal of the portions 126*b* and 126*c* of the nanostructure 126 in the inner spacer layer 170 prevents parasitic capacitance from being generated between the gate stack 210 and the nanostructure 126, in accordance with some embodiments. Therefore, the performance of the semiconductor device structure 1000 is improved, in accordance with some embodiments.

Processes and materials for forming the semiconductor device structures 200, 300, 400, 500, 600, 700, 800, 900 and 1000 may be similar to, or the same as, those for forming the semiconductor device structure 100 described above.

In accordance with some embodiments, semiconductor device structures and methods for forming the same are provided. The methods (for forming the semiconductor device structures) remove portions of nanostructures above a gate stack and in an inner spacer layer to increase the distance between the gate stack and the nanostructures, in accordance with some embodiments. Therefore, the parasitic capacitance between the gate stack and the nanostructures is decreased, in accordance with some embodiments. As a result, the performance of the semiconductor device structures is improved, in accordance with some embodiments.

In accordance with some embodiments, a method for forming a semiconductor device structure is provided. The method includes providing a substrate, a first nanostructure, a second nanostructure, a metal gate stack, and a spacer structure. The first nanostructure is between the second nanostructure and the substrate, the metal gate stack surrounds the first nanostructure and the second nanostructure, and the spacer structure surrounds an upper portion of the metal gate stack over the second nanostructure. The method includes removing the upper portion of the metal gate stack to form a first trench in the spacer structure. The method includes removing a first portion of the second nanostructure through the first trench after removing the upper portion of the metal gate stack.

In accordance with some embodiments, a method for forming a semiconductor device structure is provided. The method includes providing a substrate, a first nanostructure, a gate stack, and a spacer structure. The gate stack surrounds the first nanostructure, and the spacer structure surrounds an upper portion of the gate stack over the first nanostructure. The method includes removing the upper portion of the gate stack to form a first trench in the spacer structure. The method includes removing a first portion of the first nanostructure to form a second trench in the first nanostructure through the first trench after removing the upper portion of the gate stack. The method includes forming a dielectric structure in the first trench and the second trench. The dielectric structure has a void, and the void is between the spacer structure and the substrate.

In accordance with some embodiments, a method for forming a semiconductor device structure is provided. The method includes providing a substrate, a first nanostructure, a second nanostructure, a metal gate stack, a first source/drain structure, and a second source/drain structure. The first nanostructure is between the second nanostructure and the substrate, the metal gate stack surrounds the first nanostructure and the second nanostructure, the metal gate stack, the first nanostructure, and the second nanostructure are between the first source/drain structure and the second source/drain structure. The method includes removing an upper portion of the metal gate stack over the second nanostructure. The method includes removing the second nanostructure after removing the upper portion of the metal gate stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:

a substrate;

a first nanostructure over the substrate;

a gate stack over the substrate and surrounding the first nanostructure;

a first source/drain structure and a second source/drain structure over the substrate, wherein the gate stack is between the first source/drain structure and the second source/drain structure;

an inner spacer layer covering a sidewall of the first source/drain structure and partially between the gate stack and the first source/drain structure, wherein the first nanostructure passes through the inner spacer layer; and a dielectric structure over the gate stack and extending into the inner spacer layer, wherein the dielectric structure covers a top surface, an inner wall, and a lower surface of the inner spacer layer.

2. The semiconductor device structure as claimed in claim 1, wherein the dielectric structure is in direct contact with the top surface, the inner wall, and the lower surface of the inner spacer layer.

3. The semiconductor device structure as claimed in claim 1, wherein the first source/drain structure and the second source/drain structure surround the first nanostructure.

4. The semiconductor device structure as claimed in claim 3, further comprising:

a second nanostructure over the first nanostructure, wherein the second nanostructure has a first portion and a second portion spaced apart from each other, the first source/drain structure further surrounds the first portion, and the second source/drain structure further surrounds the second portion.

5. The semiconductor device structure as claimed in claim 4, wherein the first portion passes through the first source/drain structure and does not extend into the inner spacer layer.

6. The semiconductor device structure as claimed in claim 4, wherein the first portion passes through the first source/drain structure and partially extends into the inner spacer layer.

7. The semiconductor device structure as claimed in claim 1, wherein the gate stack comprises a gate dielectric layer, a work function layer, and a gate electrode layer sequentially stacked over the first nanostructure, and the dielectric structure is in direct contact with the gate dielectric layer, the work function layer, and the gate electrode layer.

8. The semiconductor device structure as claimed in claim 1, wherein a first distance between a first top surface of the gate stack and a second top surface of the substrate is less than a second distance between a third top surface of the first source/drain structure and the second top surface.

9. The semiconductor device structure as claimed in claim 1, wherein the dielectric structure further extends into the first source/drain structure.

10. A semiconductor device structure, comprising:

a substrate having a base and a fin over the base;

a nanostructure over the fin;

a gate stack wrapping around the fin and the nanostructure;

a first source/drain structure and a second source/drain structure over the fin, wherein the gate stack is between the first source/drain structure and the second source/drain structure;

an inner spacer layer covering a sidewall of the first source/drain structure and partially between the gate stack and the first source/drain structure, wherein the inner spacer layer surrounds the nanostructure between the gate stack and the first source/drain structure; and a dielectric structure over the gate stack, wherein the dielectric structure has an extension portion extending toward the first source/drain structure and in the inner spacer layer, wherein the extension portion has a curved concave surface facing the inner spacer layer.

11. The semiconductor device structure as claimed in claim 10, wherein the extension portion extends into the first source/drain structure.

12. The semiconductor device structure as claimed in claim 11, wherein the extension portion is wider than the inner spacer layer.

13. The semiconductor device structure as claimed in claim 11, wherein the curved concave surface extends into the first source/drain structure.

14. The semiconductor device structure as claimed in claim 13, wherein the curved concave surface is wider than the inner spacer layer.

15. The semiconductor device structure as claimed in claim 10, further comprising:

a contact structure passing through the dielectric structure and connected to the gate stack.

16. A semiconductor device structure, comprising:

a plurality of first nanostructures suspended over a substrate;

a metal gate stack wrapped around the first nanostructures;

a first source/drain structure and a second source/drain structure over the substrate, wherein the gate stack is between the first source/drain structure and the second source/drain structure;

a dielectric structure over the gate stack; and a plurality of second nanostructures over the first nanostructures, wherein each of the second nanostructures is beside the dielectric structure, the second nanostructures are wrapped around by the first source/drain structure, and the dielectric structure is in direct contact with the second nanostructures.

17. The semiconductor device structure as claimed in claim 16, further comprising:

a plurality of third nanostructures over the first nanostructures, wherein each of the third nanostructures is beside the dielectric structure, and the third nanostructures are wrapped around by the second source/drain structure.

18. The semiconductor device structure as claimed in claim 17, wherein the dielectric structure is in direct contact with the third nanostructures.

19. The semiconductor device structure as claimed in claim 16, further comprising:

a conductive contact penetrating through the dielectric structure to reach the metal gate stack.

20. The semiconductor device structure as claimed in claim 19, wherein the conductive contact extends exceeding a topmost surface and a bottommost surface of the second nanostructures.

* * * * *